(12) United States Patent
Imanishi et al.

(10) Patent No.: US 8,137,594 B2
(45) Date of Patent: Mar. 20, 2012

(54) ZINC OXIDE THIN FILM, TRANSPARENT CONDUCTIVE FILM AND DISPLAY DEVICE USING THE SAME

(75) Inventors: Yasuo Imanishi, Hitachi (JP); Etsuko Nishimura, Hitachiota (JP)

(73) Assignee: Hitachi, Ltd., Tokyo (JP)

( * ) Notice: Subject to any disclaimer, the term of this patent is extended or adjusted under 35 U.S.C. 154(b) by 800 days.

(21) Appl. No.: 12/190,617

(22) Filed: Aug. 13, 2008

(65) Prior Publication Data

US 2009/0057132 A1 Mar. 5, 2009

(30) Foreign Application Priority Data

Aug. 31, 2007 (JP) ................... 2007-226245

(51) Int. Cl.
*H01B 1/08* (2006.01)
(52) U.S. Cl. ..................... 252/519.5; 428/926
(58) Field of Classification Search ............... 252/519.5; 428/926
See application file for complete search history.

(56) References Cited

U.S. PATENT DOCUMENTS

| 6,855,996 | B2* | 2/2005 | Noguchi et al. | 257/419 |
|---|---|---|---|---|
| 7,002,179 | B2 | 2/2006 | Nakahara | |
| 7,829,207 | B2* | 11/2010 | Kato et al. | 428/698 |
| 2003/0126742 | A1* | 7/2003 | Ting et al. | 29/874 |
| 2008/0056984 | A1* | 3/2008 | Yoshioka et al. | 423/622 |
| 2010/0284893 | A1* | 11/2010 | Richards et al. | 423/437.1 |

FOREIGN PATENT DOCUMENTS

| JP | 07-106615 | 4/1995 |
|---|---|---|
| JP | 2002-270525 | 9/2002 |
| JP | 2004-304166 | 10/2004 |
| JP | 2006-073579 | 3/2006 |

OTHER PUBLICATIONS

Hong et al "Control of ZnO film Polarity", J. Vac. Sci. Technol. B 20(4), Jul./Aug. 2002 1656-1663.*
Yamabi et al "Growth conditions for wurtzite zinc oxide ... ", Journal of Materials Chemistry, pp. 3773-3778, web published Sep. 27, 2002.*
Ohnishi et al "Determination of surface polarity of c-axis oriented ZnO films ... ", Applied Physics Lett, 72(7) 1998, pp. 824-826.*
"Studies on Zinc Oxide", Research Report vol. 50, Science and Technology Agency, Inorganic Material Laboratory, Dec. 1987. Chapter 2, General description of ZnO.
JP Office action of Appln. No. 2007-226245 dated Dec. 1, 2009.

* cited by examiner

*Primary Examiner* — Mark Kopec
(74) *Attorney, Agent, or Firm* — Antonelli, Terry, Stout & Kraus, LLP.

(57) ABSTRACT

A zinc oxide thin film having desired crystallinity is fabricated. The present invention provides a zinc oxide thin film which laminated on a substrate, and which is a crystalline thin film of a wurtzite form. The c-axis of the crystalline thin film is oriented in a direction substantially perpendicular to the substrate. A zinc surface of being one polar surface of the crystalline thin film in the c-axis direction is formed in the uppermost layer. In addition, the invention also provides a zinc oxide thin film which is laminated on a substrate, and which is a crystalline thin film of a wurtzite form. The zinc oxide thin film is formed on a metal thin film layer by a thin film fabricating technique.

7 Claims, 6 Drawing Sheets

ZINC OXIDE THIN FILM, TRANSPARENT CONDUCTIVE FILM AND DISPLAY DEVICE USING THE SAME

BACKGROUND OF THE INVENTION

1. Field of the Invention

The present invention relates to a novel zinc oxide thin film, a transparent conductive film and a display device, using the same. Specifically, the present invention relates to a thin film device that is thin, lightweight and high precision and that uses a highly efficient, long-life transparent conductive film. More specifically, the present invention relates to a liquid crystal display, a plasma display panel, a field emission display, an organic electroluminescent display, and the like.

2. Description of the Related Art

Recently, demand for lightweight, highly colorful, highly bright, inexpensive and small-sized flat panel display (FPD) is increasing along with the spread of various cell phones, mobile terminals, mobile computers, car navigation systems, and the like. In addition, also at home and in offices, flat panel displays such as space-saving desktop displays and wall hanging televisions are now being substituted for conventional CRT displays. In particular, due to the diffusion of the high speed Internet and the progress of digital broadcasting, digital signal transmission of roughly several hundreds to several gigabits/second has been commercialized in both wire and wireless transmissions. Thus, an era is coming when general users exchange an extremely large set of information in real time. As such, these flat panel displays demand digital signal processable and high-speed properties in addition to lightweight, high colorfulness, high brightness, and low cost more than conventional displays do. These FPDs that are known include liquid crystal displays (LCDs), plasma display panels (PDPs), field emission displays, organic light emitting diode (OLEDs) displays, and the like. In these displays, application of an electric field and an electric current to each display pixel causes the generation of light, and adjusts the light amount. At the same time, such displays use a transparent electrode which transmits visible light, and through which an electric current can flow because the displays need to take light out of the device.

Transparent electrode materials are roughly classified into crystalline and amorphous materials. The crystalline materials that are known are indium oxide ($In_2O_3$) based materials including indium-tin oxide (ITO), zinc oxide (ZnO) based materials, tin oxide ($SnO_2$) based materials, titanium oxide ($TiO_2$) based materials and cadmium-tin oxide ($CdSnO_4$) based materials. In addition, the amorphous materials include indium zinc oxides (IZO: amorphous phase appearing as an intermediate composition of $In_2O_3$ and ZnO. Typically, 80% of $In_2O_3$). Of these, overwhelmingly spreading transparent electrode material is ITO (a substance in which tin Sn is substituted by 10 to 20% for In in $In_2O_3$ crystal), which is a kind of indium oxide ($In_2O_3$) based materials. A typical technique of forming ITO to a thin film as a transparent electrode is a sputtering method. This technique involves placing a target of ITO serving as a transparent electrode material in a vacuum chamber such that the target opposes a substrate on which a thin film is to be formed. Then, the target material is vaporized by use of argon (Ar) or oxygen ($O_2$) gas as a sputtering gas, and thereby the material is deposited on the substrate. This technique integrally forms an ITO thin film with a film thickness of several tens to several hundreds nm on a large substrate of a several m-square size. In addition, a transparent electrode formed of ITO is stable, that is, its characteristics such as properties matching with other members making up FPD and patterning processability by a photoresist are not changed even by heat treatment and the like during the fabrication processes.

However, ITO contains indium (In), which is a rare metal, as a main component. The reserve of In itself is limited, and In is only produced as a by-product of a zinc ore. Thus, it is feared that the resources will be depleted. Hence, an alternative transparent electrode material instead of ITO is craved. Of transparent electrode materials in addition to ITO, $SnO_2$ based materials and $TiO_2$ based materials have the electrical conductivity larger than that of ITO by more than one order of magnitude, and are poor in processability. Due to toxicity in Cd, $CdSnO_4$ based materials are hardly studied. Because IZO based materials have In as a main component, they are not said to be alternative materials not using In. Substances that can exhibit transparency and electrical conductivity equivalent to those of ITO are ZnO based materials, and are the most powerful candidates of the alternative material.

General physical properties of zinc oxide (ZnO) crystals are summarized in, for example, "Studies on Zinc oxide," Chapter 2, General description of ZnO, Research Report Vol. 50, Science and Technology Agency, Inorganic Material Laboratory, 1987. For example, zinc oxide (ZnO) has a wurtzite form (hexagonal crystal) structure that is produced as zincite in nature, and its bond pattern is an intermediate between ionic bond and covalent bond. The a-axis=3.249 Å, the c-axis=5.207 Å, and the polarity lies in the c-axis direction. When zinc oxide is cleaved perpendicularly to the c-axis direction, the (0001) plane on which Zn is exposed to the surface (called the Zn plane), and the (0001) plane on which O is exposed to the surface (called the O plane) are obtained. The others include the nonpolar (1120) plane and the (1010) plane. A terrace and a step are present on the surface in many cases. Moreover, the followings are known. Under a high pressure exceeding 100 kbar, NaCl form (cubic crystal) structure appears. Although ZnO produced by oxidation of Zn deposited on the copper line has the NaCl form structure as under this high pressure, it shows a crystal structure having a 10% larger lattice constant. ZnO is the group-IIb-VIb wide-gap n-type semiconductor belonging to the hexagonal crystal of the wurtzite form in a single crystal state, and its band gap is 3.2 eV, and thus ZnO is transparent in the visible region. The conduction band is formed by the σ anti-bonds of Zn 4s and O 2p. For impartment of electrical conductivity, a free carrier needs to be imparted to this conduction band. There are two kinds of free carriers of the electronic conductive ZnO: one is of a case where oxygen vacancies in the ZnO crystal or excessive Zn atoms between lattices are formed, and thus the proportion of Zn in the ZnO becomes larger than 0; and the other is of a case where Zn or O is substituted by an element the valance number of which is large (group-IIIb=B, Al, Ga, In, group-VIIb=F), and residual bond electrons becomes free electrons. Typical substitution elements are Al and Ga. The substitution ratio is at most about 5%. Both the effects of being high in the Zn proportion and addition of a substitution element are required in order to obtain electrical conductivity equivalent to that of ITO.

It has been long recognized that a zinc oxide crystal of a wurtzite form has a structure produced by alternately laminating a zinc atomic layer only formed of zinc and an oxygen atomic layer only formed of oxygen, in its c-axis direction. Depending on whether the uppermost surface layer is a zinc layer or an oxygen layer, the uppermost surface layer is called a zinc surface or an oxygen surface, respectively, and its electric polarity is positive for the zinc surface and negative for the oxygen surface. Thus, the surfaces have greatly different physical properties from each other, and both the surfaces of the zinc oxide single crystal have been studied.

In addition, difference in the polarity plane of the ZnO single crystal also appears in adsorption of and chemical reactivity with exterior substances. The techniques of making this ZnO a thin film that are adopted include, in addition to a sputtering method as for ITO, a variety of thin film fabricating methods such as reactive plasma deposition (RPD), chemical vapor deposition (CVD), molecular beam deposition (MBD) and pulsed laser deposition (PLD). For example, Japanese Patent Application Publication No. Hei 7-106615 describes a ZnO film fabricating method by molecular beam deposition. This technique fabricates a film while doping Zn or O with an element with a large valence number (group-IIIb=B, Al, Ga, In, group-VIIb=F, Cl, Br, I); however, the film fabricating speed is slow in molecular beam deposition, and a vacuum chamber also needs a super vacuum state. For these reasons, the technique is not suitable as a film-fabricating method for FPD. Generally, ZnO is high in crystallinity, and thus is crystallized from the vicinity of the substrate interface, the substrate being an amorphous substrate made of glass, metal, organic resin, or the like. A large number of crystal nuclei are generated, and the orientations are at random, whereby ZnO becomes a microcrystal at an initial stage of thin film growth. Therefore, it is thought that the ZnO needs to grow till its film thickness becomes 100 nm or larger for the ZnO becoming a denser crystalline film. A general technique in order for such a thin film to grow to a highly crystalline state from a substrate interface, is to restrain the number of crystal nuclei at an initial stage of growth, and then to cause the nucleic to grow as calmly as possible. However, it is desired that, in considering the metric size of today's substrate for FPDs and the like, such transparent electrodes be formed into a thin film as high-speedily as possible for mass production improvement. As for ITO transparent electrodes, films are formed by a sputtering method, and ITO should have the properties as a transparent electrode, the properties being the same as those of a thinner film, even if the film thickness of the ITO exceeds 100 nm from the substrate interface due to its high crystallinity. As such, a transparent electrode material in place of ITO needs to be a high crystalline film while growing from the vicinity of the substrate interface to be a predetermined thick film, even if a thin film fabricating technique with high mass productivity is used.

SUMMARY OF THE INVENTION

However, there is the problem of not fabricating a zinc oxide thin film having desired crystallinity even if the film is fabricated on a substrate in accordance with the usual method as described above. In addition, the impossibility of fabricating a zinc oxide thin film with desired crystallinity also causes the problem of not producing a transparent electrode that can satisfy desired electric characteristics and can be used as a transparent electrode.

Now, the present inventors have diligently studied and found that the crystallinity can be controlled under predetermined conditions for fabrication of a zinc oxide thin film, having the completion of the present invention.

Specifically, a zinc oxide thin film according to the present invention is laminated on a substrate, and is a crystalline thin film of a wurtzite form. The c-axis of the crystalline thin film is oriented in a direction substantially perpendicular to the substrate, and a zinc surface of being one polar surface of the crystalline thin film in the c-axis direction is formed in the uppermost layer. In addition, a zinc oxide thin film according to the present invention is laminated on a substrate, and is a crystalline thin film of a wurtzite form. The zinc oxide thin film is formed on a metal thin film layer by a thin film fabricating technique.

In addition, in the zinc oxide thin film according to the present invention, the a-axis direction of the crystalline thin film is preferably oriented in one direction within the surface of the zinc oxide thin film. In addition, the film thickness of the metal thin film layer is, for example, from 1 nm to 20 nm. Furthermore, the metal thin film layer preferably has a positive ionic polar substituent group in the uppermost layer.

Furthermore, the zinc oxide thin film according the present invention may have a second metal thin film layer different from the zinc oxide laminated directly on a crystalline thin film. The film thickness of the second metal thin film layer can be, for example, from 1 nm to 20 nm. In addition, the second metal thin film layers can include metal zinc. The second metal thin film layer may also be a transparent electrode film.

Incidentally, the zinc oxide thin film according the present invention described above itself can be used as a transparent electrode film. In other words, the zinc oxide thin film according the present invention described above can provide a display device, while being used as a transparent electrode.

On the other hand, a method of fabricating a zinc oxide thin film according the present invention includes a step of forming zinc oxide into a thin film on a metal thin film layer by means of a thin film fabricating technique. The zinc oxide thin film formed on the metal thin film is a crystalline thin film of a wurtzite form. The c-axis of the crystalline thin film is oriented in a direction substantially perpendicular to the substrate. A zinc surface of being one polar surface of the crystalline thin film in the c-axis direction is formed in the uppermost layer of the zinc oxide thin film.

In particular, the method of fabricating a zinc oxide thin film according the present invention further includes a step of forming the metal thin film layer on the substrate in vacuum. After the metal thin film layer is formed in the vacuum, the zinc oxide thin film is subsequently formed while the vacuum is maintained. As the thin film fabricating technique, a sputtering method can be used. In addition, in the step of forming zinc oxide into a thin film, the substrate temperature is preferably from 200° C. to 300° C. Furthermore, in the step of forming zinc oxide into a thin film, preferably, a predetermined film thickness of the zinc oxide thin film is formed at room temperature in initial stage film formation, and subsequently the residual film thickness is formed. The initial stage film fabrication makes use of a sputtering method by low electric power, and the residual film thickness is preferably formed by vapor deposition.

The zinc oxide thin film according the present invention has desired crystallinity in which the polarity and orientation of zinc oxide are controlled on a certain substrate, and thus is a denser and less defective thin film. In addition, the transparent electrode according the present invention primarily has a zinc oxide thin film having desired crystallinity in which the polarity and orientation of zinc oxide are controlled on a certain substrate, and thus is excellent in electric characteristics.

DESCRIPTION OF THE PREFERRED EMBODIMENTS

Hereinafter, the present invention will be described in detail with reference to the drawings.

A zinc oxide thin film according the present invention is laminated on a substrate. The zinc oxide thin film is a crystalline thin film of the wurtzite form. The c-axis of the crystalline thin film is oriented in a direction substantially perpendicular to the substrate, and a zinc surface of being one polar surface of the crystalline thin film in the c-axis direction is formed in the uppermost layer. In addition, the zinc oxide thin film according the present invention is laminated on a substrate. The zinc oxide thin film is a crystalline thin film of the wurtzite form, and is formed on a metal thin film layer by a thin film fabricating technique.

Figure 1:
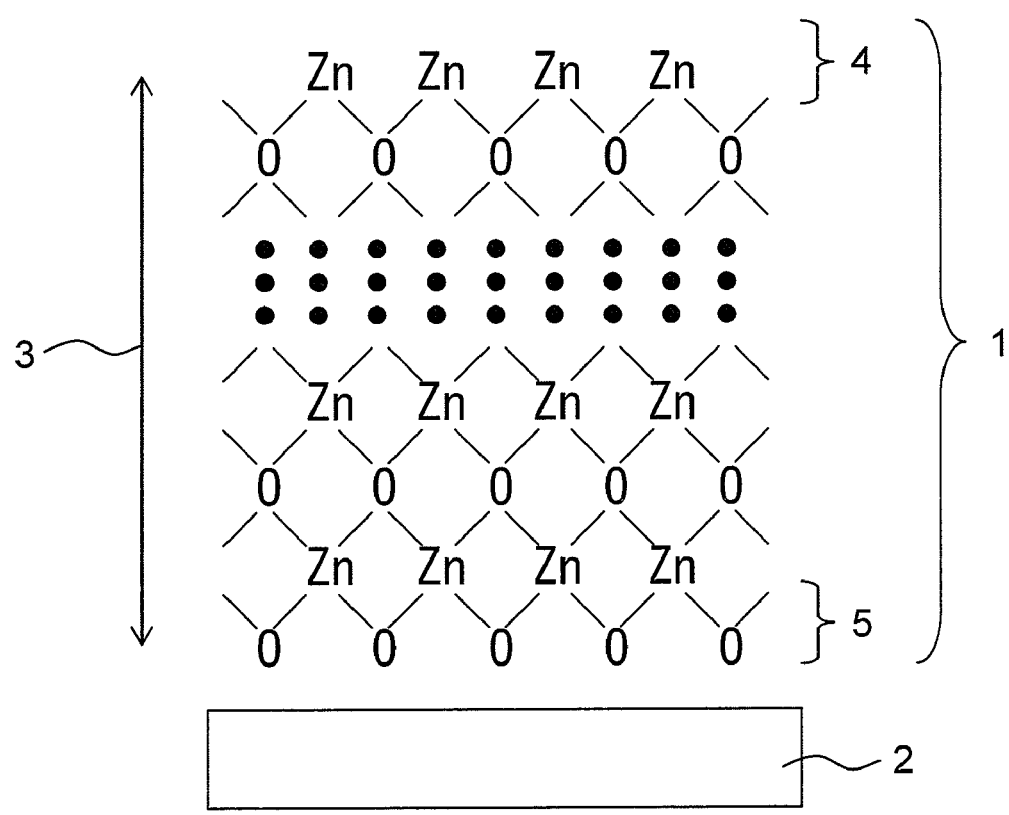
FIG. 1 is a schematic block diagram of a zinc oxide thin film according the present invention.

FIG. 1 shows a basic constitution of the zinc oxide thin film according the present invention. The figure schematically shows that the zinc oxide thin film 1 of the present invention is formed on the substrate 2 and that a zinc Zn atom and an oxygen O atom making up the zinc oxide thin film 1 are bonded to each other. The zinc oxide thin film of the present invention is of a wurtzite form and the c-axis direction 3 of the zinc oxide thin film is formed in a direction substantially perpendicular to the substrate. In the wurtzite form crystal that is a hexagonal crystal, its a-axis direction is perpendicular to the c-axis, and thus is not particularly shown in the constitution of FIG. 1. The a-axis of the zinc oxide thin film 1 is in a direction parallel to the substrate surface. A characteristic point of the present invention is that an uppermost layer 4 in the c-axis direction is all formed of zinc Zn atoms; namely, the zinc surface of zinc oxide is formed in the uppermost layer. Incidentally, the atomic layer closest to the substrate of the zinc oxide thin film is referred to as a lowest layer 5.

Herein, a zinc oxide thin film refers to an inorganic compound thin film formed of zinc Zn and oxygen O as main components. In addition to these, the zinc oxide thin film is capable of containing a number of elements as additional elements. Such additional elements can include, for example, elements such as boron B, aluminum Al, gallium Ga, indium In, carbon C, silicon Si, germanium Ge, tin Sn, nitrogen N, fluorine F, scandium Sc, titanium Ti, vanadium V and nickel Ni as additional elements in addition to zinc Zn and oxygen O.

In addition, the fact that a zinc oxide thin film targeted by the present invention is crystalline is that the film is crystalline at normal use temperature and at a normal pressure range. Its pressure range is the atmospheric pressure or less, and its temperature is in a temperature range where zinc oxide is solid under that pressure. It is possible to consider the case where its use pressure is higher. In this case, however, whether the zinc oxide targeted by the present invention is crystalline or not is distinguished by its crystalline structure being a wurtzite form. In its crystalline structure, a zinc oxide ZnO single crystal not containing additional elements at all is known as the simplest composition, and ZnO of the present invention exhibits almost the same crystallographic features.

The zinc oxide of this wurtzite form (hexagonal crystal) has a polarity in its c-axis direction, and the atom surface of zinc Zn and the atom surface of oxygen are alternately laminated in the c-axis direction. The zinc oxide thin film of the present invention is fabricated such that, of these, the zinc Zn surface becomes the uppermost layer 4.

In addition, that the c-axis is oriented substantially perpendicular to a substrate, in the present invention, means that the zinc oxide thin film is laminated on a substrate surface, and that its crystal c-axis is grown in a direction substantially perpendicular to a substrate surface. A direction in which its c-axis is substantially perpendicular means that, for example, the diffraction peaks of at least 90%, preferably 95% or more in the c-axis direction are predominantly detected relative to the peaks of the entire zinc oxide thin film when a structure analysis technique such as x-ray diffraction is used. In addition, that the a-axis direction of the zinc oxide thin film is oriented in one direction within the thin film surface, in the present invention, means that: the zinc oxide thin film is laminated on a substrate; that its crystal a-axis is grown in parallel to the substrate surface; and concurrently that the orientation direction within its substrate surface is substantially oriented in a specific direction. A state in which its a-axis is oriented in a specific direction refers to a direction in which the diffraction peaks of at least 80%, preferably 90% or more, more preferably 95% or more in the a-axis direction are predominantly detected relative to the peaks of the entire zinc oxide thin film when a structure analysis technique such as x-ray diffraction is used.

In addition, the substrate 2 that can be used, although described in detail below, includes: a glass substrate of general borosilicate glass such as Corning 1737, fused quartz, and the like; a single crystal substrate such as silicon and quartz, a metal substrate such as SUS, copper and aluminum; a plastic substrate such as polycarbonate and polyacrylate; or a multilayer substrate of combinations thereof. Additionally, the substrate 2 that can be used includes: a substrate formed of inorganic substances such as glass, silicon and gallium arsenide; a substrate formed of organic substances such as polycarbonate, polyethylene, polystyrene, polypropylene and polymethylmethacrylate; or a substrate produced by conjugating both of the above substrate. These substrates 2 can be molded from its base material by a technique such as cutting and polishing, injection molding, sandblast or dicing. However, each substrate 2 is a matrix upon forming the thin film thereon, and the thin film is not directly formed on the substrate surface. In the zinc oxide thin film according the present invention, for example, a metal thin film layer is formed on the substrate 2, and thereby the zinc oxide thin film is allowed to epitaxially grow on the specific azimuth surface of a single crystal substrate. For example, the surface of the substrate 2 is ultra-cleaned, and then a metal thin film layer is formed thereon. Thereafter, the polar surface of the zinc oxide thin film and the orientation direction within the thin film surface are controlled on the metal thin film layer, and thereby a film is fabricated.

In the zinc oxide thin film layers according the present invention, the metal thin film layers of becoming a sublayer can include, for example, a metal zinc film. In addition, the metal thin film layer is not limited to a thin film formed of metal zinc so long as the crystalline orientation of the zinc oxide thin film formed thereon can be controlled, and the examples that may be used include, for example, metals such as copper, silver, gold, platinum, tungsten, molybdenum, chrome, nickel, zirconium and alloys of these metals. In addition, the metal thin film layer preferably has a film thickness of 1 nm to 20 nm. If the film thickness of the metal thin film layer is less than 1 nm, the layer becomes an island structure in some cases, whereby the crystal orientation of the zinc oxide thin film may not be controlled. Additionally, if the film thickness of the metal thin film layer exceeds 20 nm, transparency as a whole may be lost so that the film may not be used as a transparent electrode.

The techniques for fabricating the zinc oxide thin film of the present invention, which can be adopted include a variety of thin film fabricating techniques such as spin-coating, coating, casting, sputtering, vacuum deposition, molecular beam deposition, liquid-phase epitaxial growth, atomic layer epitaxial growth, a rolling process, screen printing, ink-jet printing, electropolymerization, a rubbing method, a spray method, a casting on water method, a Langmuir-Blodgett method, plasma chemical vapor deposition, and sol-gel processing. However, it is desired that these various thin film fabricating techniques do not lose the orientation regulation effect of the metal thin film layer on which the zinc oxide thin film is directly formed as described below in its thin film forming process. In addition, for promotion of orientation during or after the film formation, it is also possible to use: heating or cooling of the substrate; light, an electromagnetic wave, an electric field or a magnetic field; the degree of vacuum in film fabricating environments; a gas in the environment; or the like, as a means for optimizing film fabricating conditions, before, after or during film fabrication.

As described above, the zinc oxide thin film according the present invention is a crystalline thin film of the wurtzite form. The c-axis of the crystalline thin film is oriented in a direction substantially perpendicular to the substrate. The zinc surface of being one polar surface of the crystalline thin film in the c-axis is formed in the uppermost layer. Accordingly, the zinc oxide thin film according the present invention has the zinc surface of one of the polar surfaces formed on the uppermost layer, and thus is stable for gases in a variety of process environments, such as water, oxygen and carbon dioxide. The adhesion properties of such gases from the outside are controlled, whereby the stabilities of the electrical conductivity and the transmittance of the entire zinc oxide thin film are also improved. In addition, the zinc oxide thin film according the present invention is controlled in its polar surface. Thus, the zinc oxide thin film is high in crystallinity even in an extremely thin film in the initial stage of growth, and is also excellent in controllability of etching properties in patterning processing. Furthermore, the zinc oxide thin film according the present invention has the zinc surface of one of the polar surfaces formed in the uppermost layer, and thus is capable of being used also as substrates for other material thin films. In other words, the zinc oxide thin film according the present invention is used not only as a transparent electrode, but further also used as another material thin film of high quality by formation of a second metal thin film layer.

In particular, it is extremely desired that the thin film growth from the substrate interface be controlled in order to use the zinc oxide thin film according the present invention as a transparent electrode for FPD in place of ITO. As described above, when a thin film of zinc oxide is formed on a metal thin film layer, the film can be formed by a sputtering method at a high-speed and in a large area. When formed, the ratio of Zn in the zinc oxide thin film is large. Furthermore, the thin film is certainly improved in crystallinity from the initial stage of film fabrication. In this manner, when the zinc oxide thin film according the present invention is fabricated by means of a sputtering method, the ZnO thin film can be formed entirely in a range of a relatively large area, the thin film being high in crystallinity even when an existing fabrication facility is used, as compared with the case where a thin film is fabricated at an extremely low speed as an MBE method, a PLD method or the like is used, and fabricated in a range of a limited small area by precisely controlling film fabricating conditions.

In addition, various precise processing techniques in a process of producing its thin film or a device can be used for the fabrication of the zinc oxide thin film according the present invention in order to fabricate the thin film or device structure as needed. The examples include a precised diamond cutting process, a laser process, an etching process, photolithography, reactive ion etching, focused ion beam etching, and the like. In addition, thin films or devices processed in advance can also be arranged in multiple, multilayered, bonded by an optical waveguide therebetween, or sealed without any modification.

In addition, the zinc oxide thin film or the device according the present invention can also be stored in a container filled with an inert gas or an inert liquid. Additionally, a cooling or heating mechanism can be co-existed for adjusting its operation environments. The materials capable of being used for the container include various metals such as copper, silver, stainless steel, aluminum, brass, iron and chrome and alloys thereof, or composite materials produced by dispersing the metal in a polymer material such as polyethylene and polystyrene, ceramic materials and the like. In addition, heat insulating layers that can be used include styrofoam, porous ceramics, glass fiber sheets, paper, and the like. In particular, coating for preventing dew condensation can also be carried out. In addition, the inert liquid loaded inside that can be used includes liquids such as water, deuterated water, alcohol, wax with low melting point, mercury, and mixtures thereof. Additionally, the inert gases loaded inside that can be used include helium, argon, nitrogen, and the like. Moreover, a desiccant can also be placed inside the container in order to decrease humidity therein.

In addition, the zinc oxide thin film according the present invention may be subjected to treatment for improvement of appearance and characteristic and for life elongation, after the product is formed. These post treatments include thermal annealing, radiation irradiation, electron beam irradiation, light irradiation, electromagnetic wave irradiation, magnetic wave irradiation, ultrasonic wave irradiation, and the like. Furthermore, the organic electroluminescent device can be made into various composites using a means depending on its applications or purposes such as adhesion, melting adhesion, electro-adhesion, vapor deposition, pressure adhesion, dye-adhesion, furnace-melting adhesion, mixing, press forming and coating. In addition, a device, particularly a display device, produced by using the zinc oxide thin film according the present invention as a transparent conductive film is made close to an electronic circuit for driving, and thereby the device can be packaged in a high density, and also integrated with an interface, antenna, or the like of transmitting and receiving of signals to and from the outside.

Figure 2:
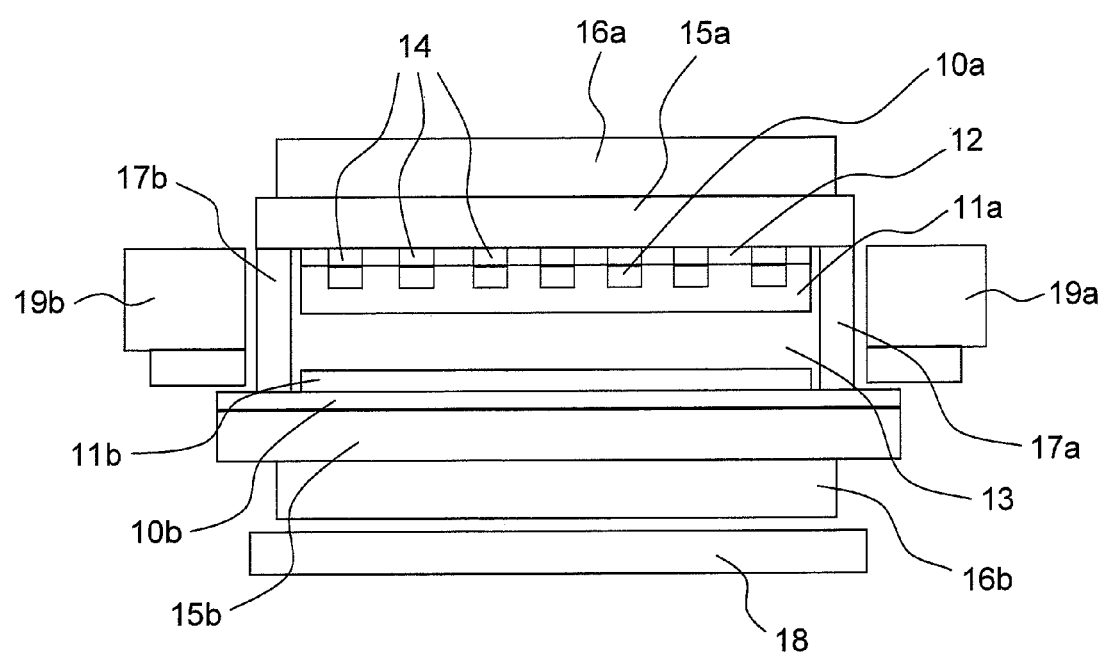
FIG. 2 is a schematic sectional view of a main part of a display device (liquid crystal display) using, as a transparent electrode, the zinc oxide thin film according the present invention.
Figure 3:
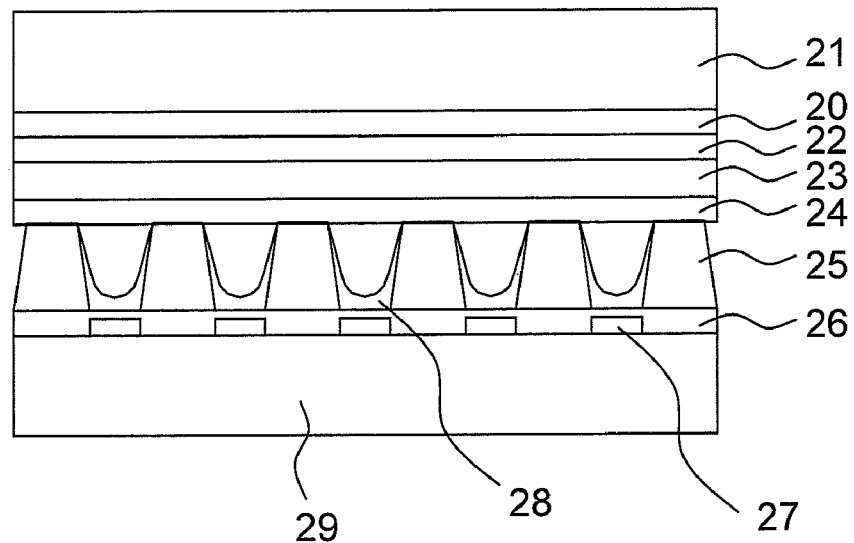
FIG. 3 is a schematic sectional view of a main part of a display device (plasma display panel) using, as a transparent electrode, the zinc oxide thin film according the present invention.
Figure 4:
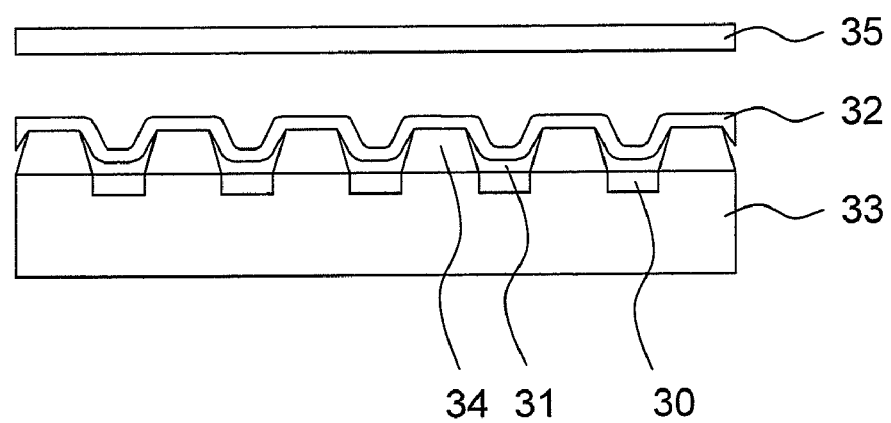
FIG. 4 is a schematic sectional view of a main part of a display device (organic light emitting diode display) using, as a transparent electrode, the zinc oxide thin film according the present invention.

One example of the display device using the zinc oxide thin film according the present invention as a transparent electrode is illustrated in FIGS. 2 to 4. In addition, the display devices indicated in FIGS. 2 to 4 are application examples of the present invention, and specific structures are by no means limited thereto.

FIG. 2 shows a device structure when the present invention is adopted to a liquid crystal display as a display device. In this device, illustrated is a type of a liquid crystal display in which a liquid crystal is sandwiched between substrates with transparent electrodes facing above and below. Transparent electrodes 10a and 10b are formed on substrates 15a and 15b facing upward and downward. On a surface of the upper substrate 15a, a color filter 14 of RGB, a black matrix 12, a transparent electrode 10a, an oriented film 11a, and the like, are formed. The surface is in contact with a liquid crystal 13. A polarizer film 16a is affixed to the other surface, opposite to the liquid crystal 13 side, of the substrate 15a. In addition, on a surface of the lower substrate 15b, the transparent electrode 10b and an oriented film 11b are formed. The surface is in contact with the liquid crystal 13. A polarizer film 16b is affixed to the other surface, opposite to the liquid crystal 13 side, of the substrate 15b. To its further lower part, disposed is a fluorescent light 18. The substrates 15a and 15b above and below are kept at a constant interval via adhesion materials 17a and 17b. The liquid crystal 13 is loaded between the substrates 15a and 15b. driving circuits 19a and 19b are disposed in outer part of the substrate 15a and 15b.

FIG. 3 shows a device structure when the present invention is adopted to a plasma display panel as a display device. In this device, a transparent electrode 20 as a display electrode is disposed on a full surface glass substrate 21. Furthermore, a bus electrode 22, a dielectric layer (upper part) 23 and a cover layer (MgO) 24 for restraining voltage drop are formed thereover. Below them, a structure is formed on top of a back surface substrate 29 containing an RGB phosphor 28. The structure further includes a display electrode 27, a dielectric layer 26, a bank 25, and the like.

FIG. 4 shows a device structure when the present invention is adopted to an organic light emitting diode display as a display device. In this device, a transparent electrode (anode) 30 is formed on a glass substrate 33. An organic layer 31 containing an RGB emission layer is formed on the transparent electrode 30. These are partitioned by a bank 34, and a cathode 32 is formed so as to cover the whole. The entire device is covered with an encapsulation cap 35 (abbreviatedly shown), and protected so as not to be in contact with the outside air.

In the various display devices made up as described above, the above-described zinc oxide thin film is used as the transparent electrode in place of ITO. This zinc oxide thin film, as described above, has the zinc surface of one of polar surfaces formed in the uppermost layer, whereby the stabilities of the electrical conductivity and the transmittance of the entire zinc oxide thin film are improved by controlling, for example, the gas adhesion properties to the surface. Thus, the zinc oxide thin film is thin, lightweight, highly precision, and exhibits high efficiency and a long life.

EXAMPLES

The present invention will be described in detail by way of Examples hereinafter; however, the invention is by no means limited, in its technical scope, to the Examples below.

Example 1

Figure 5:
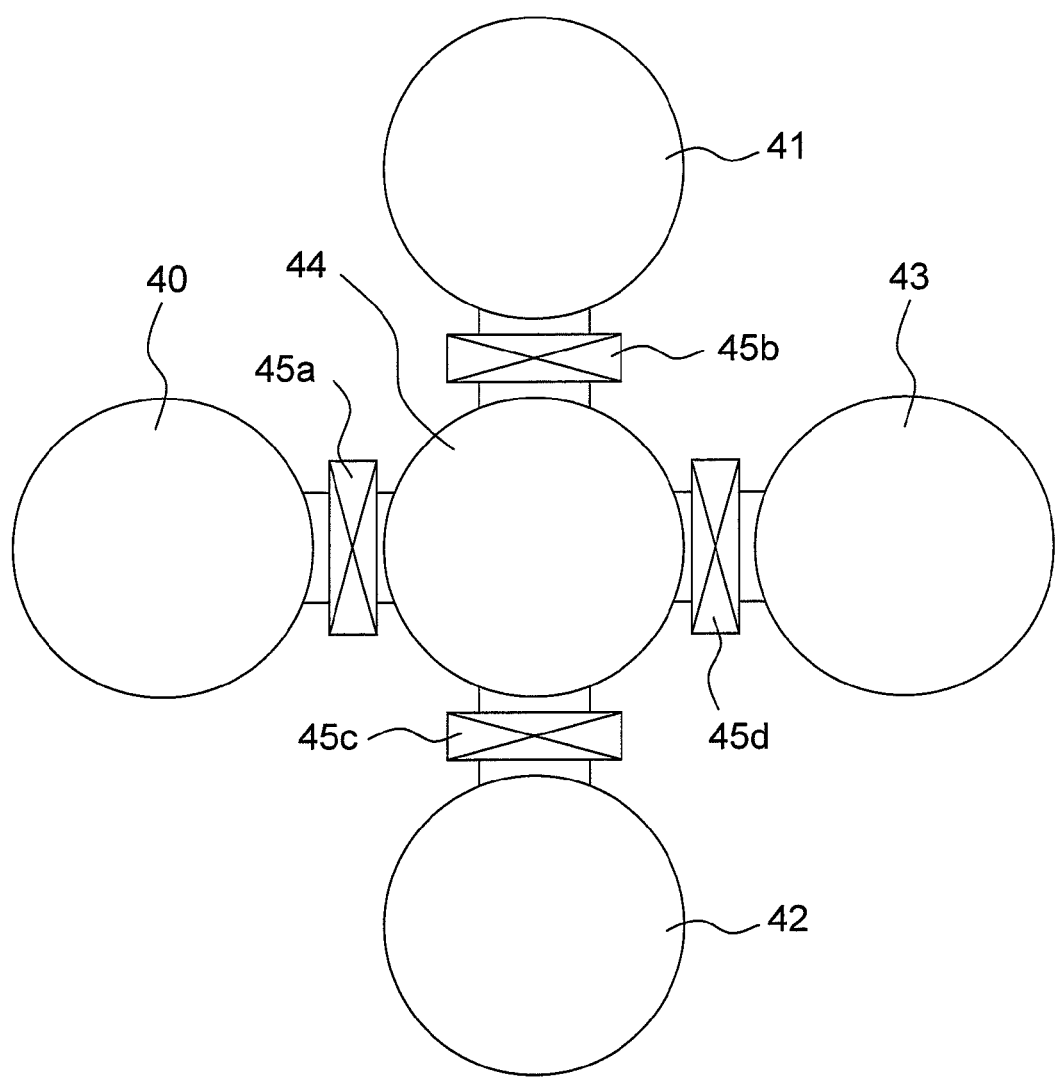
FIG. 5 is a schematic block diagram indicating one example of equipment for thin film fabrication of zinc oxide according the present invention.

One example of a thin film fabricating process for fabricating a zinc oxide thin film of the present invention will be set forth with reference to FIG. 5. FIG. 5 indicated a constitution of vacuum equipment for thin film fabrication of zinc oxide of the present invention. This vacuum equipment for thin film fabrication includes a loading chamber 40 for carrying a substrate in the equipment, an analysis chamber 41 for analyzing a substrate surface state, a sputter chamber 42 for forming a zinc oxide thin film, a deposition chamber 43 for depositing substances except a zinc oxide thin film and a transfer chamber 44 for assigning the substrate introduced from the loading chamber 40 to the other vacuum chambers 41 to 43 without breaking vacuum, each including gate valves 45a, 45b, 45c, 45d. These five vacuum chambers are each evacuated by independent vacuum pumps that are not particularly shown. Of these, the loading chamber 40, the sputter chamber 42, deposition chamber 43 and the transfer chamber 44 are each evacuated by turbo molecular pumps, and their base pressure is $1 \times 10^{-8}$ Torr. The analysis chamber 41 is evacuated by an ion getter pump, and its base pressure is $1 \times 10^{-9}$ Torr.

The analysis chamber 41 is equipped with an XPS (X-ray Photoelectron Spectroscopy) analysis equipment, and can perform surface analysis without exposing a substrate or a film forming sample. Therein, a He and Ar switchable local sputtering mechanism is disposed for sputtering a sample surface for analyzing dirt of a substrate surface and a sample surface from a film surface to an inside electronic state.

The sputter chamber 42 is provided with a commercially available target material for sputtering zinc oxide, and the target material is exchangeable independently of the sputter chamber 42 as necessary. A mechanism is disposed that can use at most five kinds of gases of argon (Ar), oxygen ($O_2$), hydrogen ($H_2$), nitrogen ($N_2$) and carbon dioxide ($CO_2$) for sputtering gas. Opening and closing of the valve and the gas flow rate are, as appropriate, adjusted so that the single gas or mixed gas can be used for sputtering purposes. Argon (Ar) is mainly used for typical zinc oxide thin film fabrication, and its gas flow rate is 50 sccm. The degree of vacuum of the sputter chamber 42 during gas inflow is adjusted to hold $5 \times 10^{-3}$ Torr. When gases are mixed for sputtering purposes, argon (Ar) is made to be the main gas, and other gases are mixed therewith. The mixture ratio is adjusted depending on the ratio of the gas flow rate. Sputtering is carried out by a direct current sputtering method, and a typical application electric power is, as appropriate, adjusted in the range of from 200 W to 600 W. In addition, the sputter chamber 42 is provided with a substrate heater, and the substrate temperature is adjustable in the range of from room temperature to a maximum of 300° C. The distance between the substrate and the target directly on the target is 150 mm. Within the sputter chamber 42, the substrate is moved in a horizontal direction directly on the target during sputtering discharge thereby to deposit the target material on the substrate. The deposit amount is controlled by a sputtering gas species, the flow rate, the sputtering electric power and the traveling speed of the substrate. The film thickness of the film formed in advance in some sputtering conditions is measured by a level difference meter to obtain the calibration relation between the vapor deposition conditions and the resulting film thickness.

In addition, the deposition chamber 43 is settable of maximally four deposition boats of a resistance heating type, and four kinds of materials can be vacuum-deposited at the same time. The distance between the deposition boat and the substrate is 300 mm, the substrate temperature is adjustable in the range from room temperature to a maximum of 300° C., and the substrate is immobilized during vapor deposition. In addition, the amount of vapor deposition is controlled by a quartz oscillation type thickness gauge disposed in the vicinity of the substrate and each deposition boat counter position. Moreover, a shutter is disposed between the substrate and the deposition boat. At first, a predetermined electric power is supplied to the deposition boat. Then, the shutter is opened to start vapor deposition at the time when a certain amount of evaporation is reached that is detected by the quartz oscillation type thickness gauge disposed in each deposition boat counter position. The shutter is closed to complete the vapor deposition when a predetermined film thickness is reached that is determined by the thickness gauge in the vicinity of the substrate. However, the amount of vapor deposition of each vapor deposition material, which is detected by the thickness gauge, and an actual film thickness are separately calibrated by the film thickness of an actual vapor deposition film determined by the level difference meter.

In addition, the transfer chamber 44 is provided with a heater for heating the substrate surface in a vacuum state, and the heater can heat the substrate surface from room temperature to a maximum of 1000° C.

Figure 6:
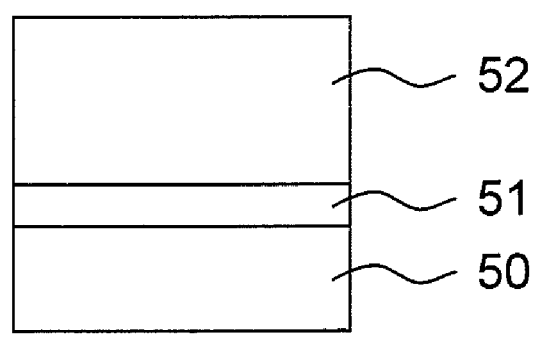
FIG. 6 is a schematic block diagram indicating a constitution of a zinc oxide thin film fabricated in Example.

Next, one example of a process of fabricating a zinc oxide thin film of the present invention will be set forth with reference to FIG. 6 by use of this vacuum equipment for thin film fabrication.

As a first stage, a substrate 50 was prepared within the vacuum equipment for thin film fabrication. Specifically, the substrate used was non-alkali glass (Asahi Glass CO., LTD.: AN100, 100×100×0.7 mm). The purchased substrate was first rub-washed with a neutral detergent, and then subjected to cleaning under running deionized water and ultrasonic cleaning in deionized water. Thereafter, the substrate was dried in a clean baking oven. The resultant substrate was ozone-cleaned using an ultraviolet-ray irradiation equipment, and then immediately set on a special-purpose substrate holder. Subsequently, the substrate was carried in the vacuum equipment for thin film fabrication from the loading chamber 40, and then the equipment was immediately evacuated to vacuum. When the pressure became $1 \times 10^{-7}$ Torr or less, the gate valves 45a, 45d were opened, and the substrate together with the substrate holder was carried in the deposition chamber 43 using a carrying rod (not shown particularly) without breaking the vacuum. Next, the gate valves 45a, 45d were closed. In this manner, the substrate 50 was prepared.

As a second stage, a metal thin film layer 51 was formed on the substrate. Specifically, before the substrate 50 is carried in, a number of vapor deposition starting materials are set in the deposition boat of the deposition chamber 43. Once, preparation was made for carrying-in of the substrate 50 in a state in which the deposition boat was electrified to an evaporation temperature thereby to degas. On one hand, in Examples below, shown are the results of the effects tested when several metals were changed. On the other hand, in this first Example, metal zinc (JAPAN PURE CHEMICAL CO., LTD., Purity 4N) was used as vapor deposition starting material. Here, as the substrate temperatures, room temperature (about 23° C.), 50° C. and 100° C. were studied, and their vapor deposition amounts were determined by the quartz oscillation type thickness gauge, with the metal layer film thicknesses Lmetal being set at 0 nm, 0.5 nm, 1 nm, 3 nm, 6 nm, 10 nm, 20 nm. Single films of the metal thin film layers 51 on top of the substrates 50 were formed in combinations of these substrate temperatures and the metal layer film thicknesses, and the thin film formation states were analyzed by XPS in the analysis chamber 41. Thereby, it was ascertained in advance whether or not a signal of the silicon Si 2p orbital, the silicon being a main component of the glass of the substrate 50 (a state in which no signal was detected was defined as a case where the signal of the substrate glass was 5% or less in composition ratio as compared with a signal of the zinc Zn 2p orbital, the zinc being a component of the metal thin film layer 51 formed on the substrate 50). In this manner, the substrate having the metal thin film layer 51 formed thereon was carried in the sputter chamber 42 by immediately opening the gate valves 45c, 45d without braking the vacuum. Then, the gate valves 45c, 45d were immediately closed, and the substrate was supplied to the subsequent third stage.

In the third stage, a zinc oxide thin film 52 was formed. Specifically, the ZnO target used was ZnO doped with 3% Al (TOSOH CORPORATION). A number of conditions were selected for the substrate temperature, the vapor deposition film thickness and the applied electric power, during sputtering. In other words, the substrate temperature was room temperature; as for vapor deposition film thickness, the final film thickness was selected from 70 nm, 150 nm and 300 nm; and the applied electric power was selected from 200 W, 300 W, 400 W. A sample having reached the final film thickness, particularly when the substrate temperature was higher than room temperature, was immediately left to stand to cool to room temperature. Thereafter, the substrate was carried to the loading chamber 40 by opening the gate valves 45a, 45c without breaking the vacuum. After the gate valves 45a, 45c were closed, the loading chamber 40 was returned to the atmospheric pressure, and the sample was taken out.

By the technique as described above, the zinc oxide thin film of the present invention was obtained. Next, a method will be described that ascertained whether or not the desired c-axis of the crystalline thin film for the zinc oxide thin film obtained in that manner was oriented perpendicular to the substrate, and concurrently whether or not the zinc surface of being one polar surface of the crystalline thin film in the c-axis was formed in the uppermost layer.

The crystallinity of the zinc oxide thin film was analyzed by the X-ray diffraction method. The resulting thin film was taken out in the atmosphere, and the crystalline state of the thin film in the film thickness direction (RINT2500HL available from Rigaku Corporation, x-ray source Cu, x-ray power output 50 kV-250 mA, scanning axis 2θ/θ interlocking, scanning range $5 \leq 2\theta \leq 90$ deg, step 0.02 deg/step) and the crystalline state within the film surface (ATX-G available from Rigaku Corporation, x-ray source Cu, x-ray power output 40 kV-400 mA, scanning axis $2\theta_{\chi/\phi}$, scanning range $20 \leq 2\theta \leq 80$ deg, scanning speed 1.0 deg/, step 0.05 deg/step, incident angle 0.4 deg) were analyzed by a x-ray diffraction apparatus. When the x-ray diffraction of the resulting thin film was measured, a number of diffraction peaks were obtained. These peaks were made to correspond to information on the x-ray diffraction peaks of zinc oxide registered in powder x-ray diffraction data JCPDS (ICDD), and the assignment of the peaks was made. Among those, the fact that the resulting zinc oxide thin film has crystallinity can be ascertained by identifying a number of diffraction peaks by x-ray diffraction measurement. In addition, the fact that the c-axis direction is oriented perpendicular to the substrate can be determined by measurement of the crystal state in the film thickness direction in which the diffraction peaks in the c-axis direction, i.e., (002), (004), . . . (002n) (where, n=1, 2, 3 . . . ) are only detected and in which diffraction peaks in other directions, for example (100), (101), (102), (110), (103), (200), (112), (201), (202), and the like are not detected. Actually, when the peak intensity of the main diffraction peak (002) in the c-axis direction is set at 1, the c-axis have been determined to be oriented perpendicular to the substrate if diffraction peak intensities in directions other than the c-axis are 1% or less.

The polarity of the zinc oxide thin film was determined by analyzing the surface state with an XPS spectroscopy instrument in the film fabricating equipment and by a technique in which the resulting thin film is taken out of the film fabricating equipment to evaluate its etching characteristics. The evaluation in the film fabricating equipment, used was an XPS spectroscopy instrument (X-ray photoelectron spectroscopy (XPS) instrument AXIS-HS, X-ray source monochrome Al, tube voltage 15 kV, tube electric current 15 mA, analysis area 600×1000 μm², resolution pass energy 40, ion-gun setting acceleration voltage 2.5 kV, ion-gun excitation electric current 15 ma, He or Ar gas pressure 3×10⁻⁵ Pa, available from Shimadzu/Kratos Corp.). Whether the zinc oxide thin film surface thus formed is the Zn surface or the O surface is normally not easily determined by measurement with XPS only. The determination can also be made by the angel spectroscopy of its photoelectron.

However, here, the polarity was determined by an easier and simpler method. Specifically, as compared with the O surface, the Zn surface of zinc oxide tends to adsorb environmental gas, particularly gases such as $O_2$, CO, $H_2O$ and the like to thereby relax the structure of the surface of the first layer. This characteristic was utilized: within the sputter chamber 42 in which the film formation was finished, a voltage for sputtering was not applied, but the same flow rate as that used when only $CO_2$ gas was sputtered was continuously used for 30 minutes, and thereby $CO_2$ was adsorbed on the surface. This sample was similarly carried to the analysis chamber 41 without breaking the vacuum, and the extent of formation of the polar surface was determined from the photoelectron signal intensity coming from the carbon C 1s of $CO_2$ adsorbed by the XPS instrument. Namely, if the uppermost surface of the zinc oxide thin film completely is the oxygen surface, $CO_2$ adsorption does not occur. The signal of the carbon C 1s the intensity of which is equal to or larger than the back ground level is not detected. However, if the uppermost surface is completely the zinc surface, $CO_2$ is strongly affixed. Thus, a strong signal of the carbon C 1s is detected (see A. N. Mariano and R. E. Hanneman: Crystallographic polarity of ZnO crystals: J. Appl. Phys. 34 (1963) 384-388).

The difference between the states of complete oxygen surface and complete zinc surface was determined by a reference value defined in the following manner using another commercially available zinc oxide single crystal substrate whose polar surface is known. In other words, the commercially available zinc oxide single crystal substrate whose polar surface is known was carried in the same film fabricating equipment, and its surface was cleaned by sputtering of the He gas contained in the analysis chamber 41. Then, the substrate was carried in the sputter chamber 42 without breaking the vacuum, and similarly exposed to the $CO_2$ gas there. After a certain period, the resulting substrate was again carried in the analysis chamber 41 without breaking the vacuum, and XPS analysis was implemented there to obtain a photoelectron signal intensity when complete oxygen and zinc surfaces were produced, which was set to be the reference value. When the photoelectron signal intensity obtained for an actual zinc oxide thin film sample was defined as Is, and when the photoelectron signal intensities for the complete oxygen surface and the complete zinc surface were defined as Io and Iz, respectively, the polarity was evaluated by (Is–Io)/(Iz–Io). The surface state when the polarity was 1 was defined as the complete zinc surface state, and the surface state when the polarity was 0 was defined as the complete oxygen surface state. In addition, it was determined that when the polarity was 0.8 or larger, the polarity was present, and that when the polarity was below 0.8, the polarity was absent.

Next, a technique of evaluating characteristics as the transparent conductive film of the resultant zinc oxide thin film will be described. The transparency of the zinc oxide thin film sample was measured using a spectrophotometer (V-570 available from JASCO Corp.), and was evaluated by the average value of light transmittances of the sample in the visible light region of wavelengths from 380 nm to 750 nm. In addition, the film thickness of the sample was measured using a level difference meter (surface shape measuring equipment: Surface Profilier P-10, available from Tencor Corp.). The film thickness was determined by measuring the level difference between the region having the zinc oxide thin film formed therein and a region that had been formed on the same substrate in advance, this latter region partially not having a zinc oxide thin film deposited by sputtering. Additionally, the electrical conductivity of the sample was measured using a sheet resistance measuring instrument (KYOWARIKEN. Co., Ltd. resistivity measuring instrument: Model K-705RM). The value of the measured sheet resistance was divided by the film thickness of the sample previously obtained was defined as a resistivity of the sample. The stability of resistivity was determined by the percentage change of a sheet resistance, measured 24 hours after the sample was stored in an atmosphere at 100° C., relative to the initial-stage resistance.

Table 1 shows the relation between the thickness of sublayer and the temperature of sublayer on the glass substrate obtained as described above. Although several temperatures of sublayer were studied, XPS signals from the substrate below the sublayer having a thickness of 3 nm or above were substantially incapable of being detected, and therefore a sufficient coverage was thought to be obtained.

TABLE 1

| Thickness of sublayer (nm) | Temperature of sublayer | | | |
|---|---|---|---|---|
| | Room temperature (23° C.) | 50° C. | 100° C. | 150° C. |
| 0 | D | D | D | D |
| 0.5 | D | D | D | D |
| 1 | D | D | D | D |
| 3 | ND | ND | ND | ND |
| 6 | ND | ND | ND | ND |
| 10 | ND | ND | ND | ND |
| 20 | ND | ND | ND | ND |

D: XPS signal detected,
ND: Not detected

In addition, Tables 2, 3 and 4 summarize, when the film thicknesses of the zinc oxide thin film are 75 nm, 150 nm and 300 nm respectively, physical properties of the resulting zinc oxide thin film such as orientation of c-axis, polarity, transmittance, resistivity and stability of resistivity, for every temperature of sublayer and for every thickness of sublayer.

TABLE 2

ZnO film thickness: 70 nm
Substrate temperature: room temperature (23° C.)
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| Room temperature | 0 | NO | NP | 95 | 2.3E−03 | 196 |
| | 0.5 | NO | NP | 95 | 2.3E−03 | 196 |

TABLE 2-continued

ZnO film thickness: 70 nm
Substrate temperature: room temperature (23° C.)
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| (23° C.) | 1 | NO | P | 95 | 2.3E−03 | 197 |
| | 3 | NO | P | 93 | 2.3E−03 | 199 |
| | 6 | O | P | 91 | 1.6E−03 | 121 |
| | 10 | O | P | 89 | 1.6E−03 | 121 |
| | 20 | NO | P | 85 | 2.3E−03 | 197 |
| 50° C. | 0 | NO | NP | 95 | 2.3E−03 | 197 |
| | 0.5 | NO | NP | 95 | 2.3E−03 | 199 |
| | 1 | NO | P | 94 | 2.3E−03 | 200 |
| | 3 | NO | P | 93 | 2.3E−03 | 199 |
| | 6 | NO | P | 92 | 2.2E−03 | 196 |
| | 10 | O | P | 90 | 1.6E−03 | 120 |
| | 20 | NO | P | 85 | 2.3E−03 | 196 |
| 100° C. | 0 | NO | NP | 96 | 2.3E−03 | 198 |
| | 0.5 | NO | NP | 94 | 2.3E−03 | 196 |
| | 1 | NO | P | 94 | 2.3E−03 | 196 |
| | 3 | NO | P | 93 | 2.3E−03 | 196 |
| | 6 | NO | P | 92 | 2.3E−03 | 197 |
| | 10 | NO | P | 89 | 2.3E−03 | 196 |
| | 20 | NO | P | 85 | 2.3E−03 | 199 |
| 150° C. | 0 | NO | NP | 95 | 2.3E−03 | 199 |
| | 0.5 | NO | NP | 94 | 2.3E−03 | 199 |
| | 1 | NO | P | 95 | 2.3E−03 | 196 |
| | 3 | NO | P | 94 | 2.3E−03 | 199 |
| | 6 | NO | P | 92 | 2.3E−03 | 197 |
| | 10 | NO | P | 90 | 2.3E−03 | 199 |
| | 20 | NO | P | 85 | 2.3E−03 | 198 |

O: Oriented,
NO: Not oriented,
P: With polarity,
NP: Without polarity

TABLE 3

ZnO film thickness: 150 nm
Substrate temperature: room temperature (23° C.)
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| Room temperature (23° C.) | 0 | NO | NP | 92 | 1.8E−03 | 170 |
| | 0.5 | NO | NP | 90 | 1.8E−03 | 169 |
| | 1 | NO | P | 89 | 1.8E−03 | 170 |
| | 3 | NO | P | 88 | 1.8E−03 | 169 |
| | 6 | O | P | 85 | 1.3E−03 | 114 |
| | 10 | O | P | 80 | 1.3E−03 | 114 |
| | 20 | NO | P | 74 | 1.8E−03 | 171 |
| 50° C. | 0 | NO | NP | 91 | 1.8E−03 | 171 |
| | 0.5 | NO | NP | 91 | 1.8E−03 | 171 |
| | 1 | NO | P | 90 | 1.8E−03 | 169 |
| | 3 | NO | P | 88 | 1.8E−03 | 169 |
| | 6 | NO | P | 86 | 1.8E−03 | 168 |
| | 10 | O | P | 80 | 1.3E−03 | 115 |
| | 20 | NO | P | 73 | 1.8E−03 | 171 |
| 100° C. | 0 | NO | NP | 91 | 1.8E−03 | 168 |
| | 0.5 | NO | NP | 91 | 1.8E−03 | 171 |
| | 1 | NO | P | 89 | 1.8E−03 | 169 |
| | 3 | NO | P | 87 | 1.8E−03 | 168 |
| | 6 | NO | P | 85 | 1.8E−03 | 170 |
| | 10 | NO | P | 81 | 1.8E−03 | 170 |
| | 20 | NO | P | 73 | 1.8E−03 | 168 |
| 150° C. | 0 | NO | NP | 92 | 1.8E−03 | 170 |
| | 0.5 | NO | NP | 91 | 1.8E−03 | 169 |
| | 1 | NO | P | 90 | 1.8E−03 | 169 |
| | 3 | NO | P | 88 | 1.8E−03 | 170 |
| | 6 | NO | P | 84 | 1.8E−03 | 170 |

TABLE 3-continued

ZnO film thickness: 150 nm
Substrate temperature: room temperature (23° C.)
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| | 10 | NO | P | 80 | 1.8E−03 | 168 |
| | 20 | NO | P | 73 | 1.8E−03 | 170 |

O: Oriented,
NO: Not oriented,
P: With polarity,
NP: Without polarity

TABLE 4

ZnO film thickness: 300 nm
Substrate temperature: room temperature (23° C.)
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| Room temperature (23° C.) | 0 | NO | NP | 85 | 1.3E−03 | 164 |
| | 0.5 | NO | NP | 83 | 1.3E−03 | 161 |
| | 1 | NO | P | 80 | 1.3E−03 | 160 |
| | 3 | NO | P | 78 | 1.3E−03 | 161 |
| | 6 | O | P | 74 | 1.2E−03 | 113 |
| | 10 | O | P | 66 | 1.1E−03 | 114 |
| | 20 | NO | P | 54 | 1.3E−03 | 164 |
| 50° C. | 0 | NO | NP | 85 | 1.3E−03 | 161 |
| | 0.5 | NO | NP | 82 | 1.3E−03 | 162 |
| | 1 | NO | P | 80 | 1.3E−03 | 163 |
| | 3 | NO | P | 78 | 1.3E−03 | 162 |
| | 6 | NO | P | 73 | 1.3E−03 | 163 |
| | 10 | O | P | 65 | 1.2E−03 | 113 |
| | 20 | NO | P | 54 | 1.3E−03 | 161 |
| 100° C. | 0 | NO | NP | 85 | 1.3E−03 | 163 |
| | 0.5 | NO | NP | 82 | 1.3E−03 | 162 |
| | 1 | NO | P | 81 | 1.3E−03 | 162 |
| | 3 | NO | P | 78 | 1.3E−03 | 164 |
| | 6 | NO | P | 73 | 1.3E−03 | 163 |
| | 10 | NO | P | 64 | 1.3E−03 | 163 |
| | 20 | NO | P | 54 | 1.3E−03 | 163 |
| 150° C. | 0 | NO | NP | 86 | 1.3E−03 | 160 |
| | 0.5 | NO | NP | 83 | 1.3E−03 | 161 |
| | 1 | NO | P | 80 | 1.3E−03 | 162 |
| | 3 | NO | P | 79 | 1.3E−03 | 162 |
| | 6 | NO | P | 74 | 1.3E−03 | 163 |
| | 10 | NO | P | 65 | 1.3E−03 | 163 |
| | 20 | NO | P | 54 | 1.3E−03 | 161 |

O: Oriented,
NO: Not oriented,
P: With polarity,
NP: Without polarity

Table 2 shows, when the zinc oxide film thickness is 75 nm, the resistivity of $2.3 \times 10^{-3}$ Ωcm without the presence of the sublayer and also a value of $1.6 \times 10^{-3}$ Ωcm smaller than that that resistivity in some cases. Any of them exhibit the c-axis orientation and the polarity. Noticeably, in their stabilities of resistivity, the zinc oxide thin films with a stability of only 190% to 200% are improved to have about 120% in stability in these cases. Tables 3 and 4 show that, when the zinc oxide film thicknesses are 150 nm and 300 nm, although the resistivities are originally different, among those where the resistivities are smaller, and further where the stabilities of resistivity are improved, any of them exhibit the c-axis orientation and the polarity. However, the larger the film thickness of the sublayer, the lower the transmittance is liable to be. In addition, as the film thickness of the zinc oxide thin film is large, the transmittance is prone to decrease. This seems to come from a change in reflectance due to light interference of the zinc oxide thin film.

When the zinc oxide thin film is used as a transparent conductive film in this way, the transmittance and resistivity need to be selected according to its purposes. Meanwhile, a lower resistance state and a more stable state can be attained in the zinc oxide thin film of the present invention.

Example 2

The present Example indicates the results in which a zinc oxide thin film was formed at a substrate temperature of 100° C. at the time of zinc oxide thin film fabrication. As the results, Tables 5, 6 and 7 summarize, when the film thicknesses of the zinc oxide thin film are 75 nm, 150 nm and 300 nm, respectively, physical properties of the resulting zinc oxide thin film such as c-axis orientation, polarity, transmittance, resistivity and stability of resistivity, for every temperature of sublayer and for every thickness of sublayer.

TABLE 5

ZnO film thickness: 70 nm
Substrate temperature: 100° C.
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| Room temperature (23° C.) | 0 | O | NP | 95 | 1.7E−03 | 183 |
| | 0.5 | NO | NP | 94 | 1.6E−03 | 184 |
| | 1 | NO | P | 94 | 1.7E−03 | 186 |
| | 3 | O | P | 93 | 1.2E−03 | 117 |
| | 6 | O | P | 91 | 1.2E−03 | 118 |
| | 10 | O | P | 90 | 1.1E−03 | 118 |
| | 20 | NO | P | 85 | 1.7E−03 | 183 |
| 50° C. | 0 | O | NP | 95 | 1.6E−03 | 186 |
| | 0.5 | NO | NP | 95 | 1.7E−03 | 183 |
| | 1 | NO | P | 95 | 1.7E−03 | 184 |
| | 3 | NO | P | 93 | 1.6E−03 | 183 |
| | 6 | O | P | 92 | 1.2E−03 | 118 |
| | 10 | O | P | 89 | 1.2E−03 | 118 |
| | 20 | NO | P | 86 | 1.6E−03 | 183 |
| 100° C. | 0 | O | NP | 95 | 1.6E−03 | 186 |
| | 0.5 | NO | NP | 94 | 1.6E−03 | 185 |
| | 1 | NO | P | 95 | 1.7E−03 | 183 |
| | 3 | NO | P | 94 | 1.7E−03 | 183 |
| | 6 | NO | P | 92 | 1.7E−03 | 184 |
| | 10 | O | P | 90 | 1.1E−03 | 117 |
| | 20 | NO | P | 86 | 1.6E−03 | 184 |
| 150° C. | 0 | O | NP | 95 | 1.7E−03 | 184 |
| | 0.5 | NO | NP | 94 | 1.7E−03 | 185 |
| | 1 | NO | P | 94 | 1.6E−03 | 186 |
| | 3 | NO | P | 93 | 1.7E−03 | 185 |
| | 6 | NO | P | 92 | 1.7E−03 | 185 |
| | 10 | NO | P | 88 | 1.6E−03 | 183 |
| | 20 | NO | P | 86 | 1.6E−03 | 183 |

O: Oriented,
NO: Not oriented,
P: With polarity,
NP: Without polarity

TABLE 6

ZnO film thickness: 150 nm
Substrate temperature: 100° C.
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| Room temperature (23° C.) | 0 | O | NP | 92 | 1.4E−03 | 157 |
| | 0.5 | NO | NP | 91 | 1.3E−03 | 156 |
| | 1 | NO | P | 89 | 1.3E−03 | 157 |
| | 3 | O | P | 87 | 1.0E−03 | 113 |
| | 6 | O | P | 85 | 9.7E−04 | 113 |
| | 10 | O | P | 80 | 1.0E−03 | 113 |
| | 20 | NO | P | 73 | 1.4E−03 | 156 |
| 50° C. | 0 | O | NP | 91 | 1.4E−03 | 155 |
| | 0.5 | NO | NP | 91 | 1.3E−03 | 157 |
| | 1 | NO | P | 89 | 1.3E−03 | 155 |
| | 3 | NO | P | 88 | 1.3E−03 | 158 |
| | 6 | O | P | 86 | 9.7E−04 | 113 |
| | 10 | O | P | 81 | 1.0E−04 | 113 |
| | 20 | NO | P | 73 | 1.3E−03 | 155 |
| 100° C. | 0 | O | NP | 92 | 1.3E−03 | 157 |
| | 0.5 | NO | NP | 91 | 1.4E−03 | 157 |
| | 1 | NO | P | 89 | 1.4E−03 | 157 |
| | 3 | NO | P | 88 | 1.4E−03 | 158 |
| | 6 | NO | P | 85 | 1.4E−03 | 156 |

TABLE 6-continued

ZnO film thickness: 150 nm
Substrate temperature: 100° C.
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| | 10 | O | P | 80 | 9.9E−04 | 111 |
| | 20 | NO | P | 74 | 1.3E−03 | 155 |
| 150° C. | 0 | O | NP | 92 | 1.3E−03 | 157 |
| | 0.5 | NO | NP | 90 | 1.4E−03 | 157 |
| | 1 | NO | P | 90 | 1.3E−03 | 156 |
| | 3 | NO | P | 88 | 1.3E−03 | 157 |
| | 6 | NO | P | 85 | 1.4E−03 | 157 |
| | 10 | NO | P | 81 | 1.3E−03 | 155 |
| | 20 | NO | P | 73 | 1.3E−03 | 156 |

O: Oriented,
NO: Not oriented,
P: With polarity,
NP: Without polarity

TABLE 7

ZnO film thickness: 300 nm
Substrate temperature: 100° C.
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| Room temperature (23° C.) | 0 | O | NP | 85 | 9.9E−04 | 148 |
| | 0.5 | NO | NP | 82 | 9.7E−04 | 147 |
| | 1 | NO | P | 80 | 1.0E−03 | 148 |
| | 3 | O | P | 78 | 8.6E−04 | 111 |
| | 6 | O | P | 73 | 8.8E−04 | 110 |
| | 10 | O | P | 65 | 8.9E−04 | 110 |
| | 20 | NO | P | 55 | 9.9E−04 | 146 |
| 50° C. | 0 | O | NP | 86 | 9.7E−04 | 147 |
| | 0.5 | NO | NP | 82 | 9.6E−04 | 146 |
| | 1 | NO | P | 80 | 9.7E−04 | 147 |
| | 3 | NO | P | 78 | 9.6E−04 | 148 |
| | 6 | O | P | 74 | 8.5E−04 | 109 |
| | 10 | O | P | 65 | 8.7E−04 | 109 |
| | 20 | NO | P | 55 | 9.6E−04 | 147 |
| 100° C. | 0 | O | NP | 85 | 9.7E−04 | 148 |
| | 0.5 | NO | NP | 82 | 9.8E−04 | 147 |
| | 1 | NO | P | 81 | 1.0E−03 | 146 |
| | 3 | NO | P | 77 | 1.0E−03 | 147 |
| | 6 | NO | P | 73 | 9.8E−04 | 148 |
| | 10 | O | P | 66 | 8.7E−04 | 110 |
| | 20 | NO | P | 54 | 1.0E−03 | 147 |
| 150° C. | 0 | O | NP | 84 | 9.6E−04 | 147 |
| | 0.5 | NO | NP | 82 | 9.6E−04 | 146 |
| | 1 | NO | P | 81 | 9.7E−04 | 147 |
| | 3 | NO | P | 78 | 9.6E−04 | 148 |
| | 6 | NO | P | 74 | 9.9E−04 | 146 |
| | 10 | NO | P | 64 | 9.8E−04 | 147 |
| | 20 | NO | P | 54 | 9.6E−04 | 147 |

O: Oriented,
NO: Not oriented,
P: With polarity,
NP: Without polarity

Table 5 shows, when the zinc oxide film thickness is 75 nm, the resistivity of 1.6 to 1.7×10$^{-3}$ Ωcm without the presence of the sublayer and also a value of 1.1 to 1.2×10$^{-3}$ Ωcm smaller those resistivities in some cases. Any of them exhibit the c-axis orientation and the polarity. Noticeably, in their stabilities of resistivity, the zinc oxide thin films with a stability of only 180% to 190% are improved to have about 117% in stability in these cases. Tables 6 and 7 show that, when the zinc oxide film thickness are 150 nm and 300 nm, although the resistivities are originally different, among those where the resistivities are smaller, and further where the stabilities of resistivity are improved, any of them exhibit the c-axis orientation and the polarity. However, the larger the film thickness of the sublayer, the lower the transmittance is liable to be. In addition, as the film thickness of the zinc oxide thin film is large, the transmittance is prone to decrease. This seems to come from a change in reflectance due to light interference of the zinc oxide thin film. Additionally, as compared with the case of Example 1, the ranges of the substrate temperature of the sublayer and the film thickness, which generate such effects, are slightly different. This seems to be because, although the sublayer was identical, the surface state of the sublayer or the structure was changed due to the temperature when the zinc oxide thin film was formed. In particular, it is shown that setting of the temperature at the time of zinc oxide thin film formation to be higher than room temperature makes it possible to control the c-axis orientation and the polarity. Thereby, a low resistivity and an excellent stability of resistivity are likely to be achieved.

When the zinc oxide thin film is used as a transparent conductive film in this way, the transmittance and resistivity need to be selected according to its purposes. Meanwhile, a lower resistance state and a more stable state can be attained in the zinc oxide thin film of the present invention.

Example 3

The present Example indicates the results in which a zinc oxide thin film was formed at a substrate temperature of 200° C. at the time of zinc oxide thin film fabrication. As the results, Tables 8, 9 and 10 summarizes, when the film thicknesses of the zinc oxide thin film are 75 nm, 150 nm and 300 nm, respectively, physical properties of the resulting zinc oxide thin film such as c-axis orientation, polarity, transmittance, resistivity and stability of resistivity, for every temperature of sublayer and every thickness of sublayer.

TABLE 8

ZnO film thickness: 70 nm
Substrate temperature: 200° C.
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| Room temperature (23° C.) | 0 | O | NP | 95 | 1.2E−03 | 179 |
| | 0.5 | NO | NP | 94 | 1.2E−03 | 182 |
| | 1 | NO | P | 94 | 1.2E−03 | 182 |
| | 3 | O | P | 93 | 8.0E−04 | 116 |
| | 6 | O | P | 92 | 8.1E−04 | 117 |
| | 10 | O | P | 89 | 8.0E−04 | 118 |
| | 20 | NO | P | 85 | 1.1E−03 | 180 |
| 50° C. | 0 | O | NP | 95 | 1.1E−03 | 179 |
| | 0.5 | NO | NP | 95 | 1.2E−03 | 181 |
| | 1 | NO | P | 94 | 1.2E−03 | 181 |
| | 3 | O | P | 93 | 8.2E−04 | 116 |
| | 6 | O | P | 92 | 8.0E−04 | 118 |
| | 10 | O | P | 90 | 8.2E−04 | 117 |
| | 20 | NO | P | 86 | 1.2E−03 | 179 |
| 100° C. | 0 | O | NP | 95 | 1.2E−03 | 181 |
| | 0.5 | NO | NP | 95 | 1.1E−03 | 180 |
| | 1 | NO | P | 93 | 1.1E−03 | 180 |
| | 3 | NO | P | 93 | 1.2E−03 | 182 |
| | 6 | O | P | 92 | 7.9E−04 | 117 |
| | 10 | O | P | 90 | 7.9E−04 | 117 |
| | 20 | NO | P | 86 | 1.2E−03 | 181 |
| 150° C. | 0 | O | NP | 96 | 1.2E−03 | 179 |
| | 0.5 | NO | NP | 94 | 1.2E−03 | 179 |
| | 1 | NO | P | 93 | 1.1E−03 | 180 |
| | 3 | O | P | 93 | 7.9E−04 | 117 |
| | 6 | O | P | 92 | 8.2E−04 | 117 |
| | 10 | NO | P | 90 | 1.2E−03 | 182 |
| | 20 | NO | P | 86 | 1.2E−03 | 179 |

O: Oriented,
NO: Not oriented,
P: With polarity,
NP: Without polarity

TABLE 9

ZnO film thickness: 150 nm
Substrate temperature: 200° C.
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| Room temperature (23° C.) | 0 | O | NP | 93 | 8.7E−04 | 150 |
| | 0.5 | NO | NP | 91 | 9.0E−04 | 152 |
| | 1 | NO | P | 90 | 8.7E−04 | 152 |
| | 3 | O | P | 87 | 6.5E−04 | 111 |
| | 6 | O | P | 85 | 6.4E−04 | 112 |

TABLE 9-continued

ZnO film thickness: 150 nm
Substrate temperature: 200° C.
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| | 10 | O | P | 80 | 6.5E−04 | 111 |
| | 20 | NO | P | 73 | 9.0E−04 | 151 |
| 50° C. | 0 | O | NP | 93 | 9.0E−04 | 152 |
| | 0.5 | NO | NP | 91 | 9.0E−04 | 152 |
| | 1 | NO | P | 90 | 8.8E−04 | 151 |
| | 3 | O | P | 88 | 6.6E−04 | 111 |
| | 6 | O | P | 85 | 6.6E−04 | 111 |
| | 10 | O | P | 81 | 6.5E−04 | 110 |
| | 20 | NO | P | 73 | 8.8E−04 | 150 |
| 100° C. | 0 | O | NP | 92 | 8.9E−04 | 152 |
| | 0.5 | NO | NP | 91 | 8.9E−04 | 151 |
| | 1 | NO | P | 89 | 8.9E−04 | 152 |
| | 3 | NO | P | 88 | 9.1E−04 | 151 |
| | 6 | O | P | 85 | 6.7E−04 | 111 |
| | 10 | O | P | 81 | 6.6E−04 | 110 |
| | 20 | NO | P | 73 | 9.0E−04 | 151 |
| 150° C. | 0 | O | NP | 91 | 8.8E−04 | 152 |
| | 0.5 | NO | NP | 90 | 9.0E−04 | 150 |
| | 1 | NO | P | 90 | 8.9E−04 | 150 |
| | 3 | O | P | 89 | 6.6E−04 | 111 |
| | 6 | O | P | 85 | 6.5E−04 | 110 |
| | 10 | NO | P | 80 | 9.1E−04 | 150 |
| | 20 | NO | P | 74 | 9.1E−04 | 149 |

O: Oriented,
NO: Not oriented,
P: With polarity,
NP: Without polarity

TABLE 10

ZnO film thickness: 300 nm
Substrate temperature: 200° C.
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| Room temperature (23° C.) | 0 | O | NP | 86 | 6.5E−04 | 137 |
| | 0.5 | NO | NP | 82 | 6.7E−04 | 138 |
| | 1 | NO | P | 81 | 6.8E−04 | 139 |
| | 3 | O | P | 77 | 6.0E−04 | 108 |
| | 6 | O | P | 73 | 6.1E−04 | 109 |
| | 10 | O | P | 65 | 6.1E−04 | 108 |
| | 20 | NO | P | 54 | 6.5E−04 | 137 |
| 50° C. | 0 | O | NP | 85 | 6.7E−04 | 138 |
| | 0.5 | NO | NP | 83 | 6.7E−04 | 139 |
| | 1 | NO | P | 80 | 6.7E−04 | 139 |
| | 3 | O | P | 78 | 6.1E−04 | 109 |
| | 6 | O | P | 74 | 6.2E−04 | 108 |
| | 10 | O | P | 65 | 6.2E−04 | 109 |
| | 20 | NO | P | 54 | 6.7E−04 | 137 |
| 100° C. | 0 | O | NP | 85 | 6.6E−04 | 138 |
| | 0.5 | NO | NP | 83 | 6.7E−04 | 137 |
| | 1 | NO | P | 81 | 6.5E−04 | 137 |
| | 3 | NO | P | 79 | 6.7E−04 | 139 |
| | 6 | O | P | 73 | 6.1E−04 | 109 |
| | 10 | O | P | 64 | 6.1E−04 | 109 |
| | 20 | NO | P | 55 | 6.7E−04 | 138 |
| 150° C. | 0 | O | NP | 85 | 6.6E−04 | 137 |
| | 0.5 | NO | NP | 82 | 6.8E−04 | 137 |
| | 1 | NO | P | 81 | 6.6E−04 | 138 |
| | 3 | O | P | 78 | 6.0E−04 | 107 |
| | 6 | O | P | 74 | 6.0E−04 | 108 |

TABLE 10-continued

ZnO film thickness: 300 nm
Substrate temperature: 200° C.
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| | 10 | NO | P | 65 | 6.6E−04 | 139 |
| | 20 | NO | P | 55 | 6.7E−04 | 139 |

O: Oriented,
NO: Not oriented,
P: With polarity,
NP: Without polarity

Table 8 shows, when the zinc oxide film thickness is 75 nm, the resistivity of 1.1 to $1.2 \times 10^{-3}$ Ωcm without the presence of the sublayer and also a value of 8.2 to $8.32 \times 10^{-4}$ Ωcm smaller those resistivities in some cases. Any of them exhibit the c-axis orientation and the polarity. Noticeably, in their stabilities of resistivity, the zinc oxide thin films with a stability of only 179% to 182% are improved to have about 116% in stability in these cases. Tables 9 and 10 show that, when the zinc oxide film thicknesses are 150 nm and 300 nm, although the resistivities are originally different, among those where the resistivities are smaller, and further where the stabilities of resistivity are improved, any of them exhibit the c-axis orientation and the polarity. However, the larger the film thickness of the sublayer, the lower the transmittance is liable to be. In addition, as the film thickness of the zinc oxide thin film is large, the transmittance is prone to decrease. This seems to come from a change in reflectance due to light interference of the zinc oxide thin film. Additionally, as compared with the case of Example 1, the ranges of the substrate temperature of the sublayer and the film thickness, which generate such effects, are slightly different. This seems to be because, although the sublayer was identical, the surface state of the sublayer or the structure was changed due to the temperature when the zinc oxide thin film was formed. In particular, it is shown that, in the present Example, the temperature at the time of zinc oxide thin film formation makes it possible to control the c-axis orientation and the polarity as compared with the cases of room temperature and 100° C. Thereby, a low resistivity and an excellent stability of resistivity are likely to be achieved.

When the zinc oxide thin film is used as a transparent conductive film in this way, the transmittance and resistivity need to be selected according to its purposes. Meanwhile, a lower resistance state and a more stable state can be attained in the zinc oxide thin film of the present invention.

Example 4

The present Example indicates the results in which a zinc oxide thin film was formed at a substrate temperature of 300° C. at the time of zinc oxide thin film fabrication. As the results, Tables 11, 12 and 13 summarizes, when the film thicknesses of the zinc oxide thin film are 75 nm, 150 nm and 300 nm, respectively, physical properties of the resulting zinc oxide thin film such as c-axis orientation, polarity, transmittance, resistivity and stability of resistivity for every temperature of sublayer and every thickness of sublayer.

TABLE 11

ZnO film thickness: 70 nm
Substrate temperature: 300° C.
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| Room temperature (23° C.) | 0 | O | NP | 96 | 5.7E−04 | 178 |
| | 0.5 | NO | NP | 94 | 5.8E−04 | 177 |
| | 1 | O | P | 93 | 5.6E−04 | 178 |
| | 3 | O | P | 93 | 4.6E−04 | 117 |
| | 6 | O | P | 92 | 4.8E−04 | 116 |
| | 10 | O | P | 89 | 4.6E−04 | 116 |
| | 20 | NO | P | 85 | 5.6E−04 | 177 |
| 50° C. | 0 | O | NP | 94 | 5.8E−04 | 178 |
| | 0.5 | NO | NP | 96 | 5.8E−04 | 177 |
| | 1 | O | P | 93 | 5.8E−04 | 177 |
| | 3 | O | P | 94 | 4.7E−04 | 117 |
| | 6 | O | P | 92 | 4.8E−04 | 116 |
| | 10 | O | P | 89 | 4.7E−04 | 115 |
| | 20 | NO | P | 85 | 5.7E−04 | 177 |
| 100° C. | 0 | O | NP | 95 | 5.8E−04 | 177 |
| | 0.5 | NO | NP | 95 | 5.8E−04 | 175 |
| | 1 | O | P | 94 | 5.8E−04 | 176 |
| | 3 | O | P | 93 | 4.7E−04 | 116 |
| | 6 | O | P | 92 | 4.6E−04 | 116 |

TABLE 11-continued

ZnO film thickness: 70 nm
Substrate temperature: 300° C.
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| | 10 | NO | P | 89 | 5.7E−04 | 176 |
| | 20 | NO | P | 86 | 5.8E−04 | 177 |
| 150° C. | 0 | O | NP | 96 | 5.7E−04 | 177 |
| | 0.5 | NO | NP | 94 | 5.6E−04 | 176 |
| | 1 | O | P | 94 | 5.7E−04 | 178 |
| | 3 | O | P | 94 | 4.7E−04 | 116 |
| | 6 | O | P | 91 | 4.8E−04 | 116 |
| | 10 | NO | P | 89 | 5.6E−04 | 176 |
| | 20 | NO | P | 85 | 5.6E−04 | 177 |

O: Oriented,
NO: Not oriented,
P: With polarity,
NP: Without polarity

TABLE 12

ZnO film thickness: 150 nm
Substrate temperature: 300° C.
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| Room temperature (23° C.) | 0 | O | NP | 91 | 4.4E−04 | 147 |
| | 0.5 | NO | NP | 90 | 4.2E−04 | 145 |
| | 1 | O | P | 89 | 4.3E−04 | 146 |
| | 3 | O | P | 88 | 3.9E−04 | 110 |
| | 6 | O | P | 86 | 4.0E−04 | 110 |
| | 10 | O | P | 80 | 3.9E−04 | 111 |
| | 20 | NO | P | 74 | 4.2E−04 | 147 |
| 50° C. | 0 | O | NP | 93 | 4.4E−04 | 145 |
| | 0.5 | NO | NP | 91 | 4.2E−04 | 147 |
| | 1 | O | P | 90 | 4.3E−04 | 148 |
| | 3 | O | P | 88 | 3.8E−04 | 109 |
| | 6 | O | P | 85 | 3.8E−04 | 111 |
| | 10 | O | P | 80 | 3.9E−04 | 111 |
| | 20 | NO | P | 74 | 4.2E−04 | 146 |
| 100° C. | 0 | O | NP | 92 | 4.3E−04 | 146 |
| | 0.5 | NO | NP | 90 | 4.2E−04 | 145 |
| | 1 | O | P | 89 | 4.2E−04 | 145 |
| | 3 | O | P | 88 | 3.9E−04 | 110 |
| | 6 | O | P | 86 | 3.8E−04 | 110 |
| | 10 | NO | P | 80 | 4.2E−04 | 145 |
| | 20 | NO | P | 73 | 4.2E−04 | 146 |
| 150° C. | 0 | O | NP | 92 | 4.3E−04 | 148 |
| | 0.5 | NO | NP | 90 | 4.3E−04 | 148 |
| | 1 | O | P | 89 | 4.3E−04 | 147 |
| | 3 | O | P | 87 | 4.0E−04 | 110 |
| | 6 | O | P | 86 | 3.8E−04 | 109 |
| | 10 | NO | P | 80 | 4.2E−04 | 146 |
| | 20 | NO | P | 73 | 4.3E−04 | 147 |

O: Oriented,
NO: Not oriented,
P: With polarity,
NP: Without polarity

TABLE 13

ZnO film thickness: 300 nm
Substrate temperature: 300° C.
Initial stage film formation: None

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| Room | 0 | O | NP | 86 | 3.6E−04 | 131 |
| temperature | 0.5 | NO | NP | 83 | 3.5E−04 | 132 |
| (23° C.) | 1 | O | P | 80 | 3.6E−04 | 130 |
|  | 3 | O | P | 78 | 3.2E−04 | 107 |
|  | 6 | O | P | 74 | 3.3E−04 | 106 |
|  | 10 | O | P | 65 | 3.2E−04 | 107 |
|  | 20 | NO | P | 55 | 3.6E−04 | 132 |
| 50° C. | 0 | O | NP | 86 | 3.6E−04 | 132 |
|  | 0.5 | NO | NP | 83 | 3.5E−04 | 132 |
|  | 1 | O | P | 81 | 3.5E−04 | 132 |
|  | 3 | O | P | 78 | 3.3E−04 | 108 |
|  | 6 | O | P | 73 | 3.3E−04 | 108 |
|  | 10 | O | P | 65 | 3.3E−04 | 107 |
|  | 20 | NO | P | 54 | 3.6E−04 | 130 |
| 100° C. | 0 | O | NP | 84 | 3.6E−04 | 132 |
|  | 0.5 | NO | NP | 83 | 3.6E−04 | 131 |
|  | 1 | O | P | 80 | 3.6E−04 | 130 |
|  | 3 | O | P | 77 | 3.4E−04 | 106 |
|  | 6 | O | P | 74 | 3.3E−04 | 108 |
|  | 10 | NO | P | 66 | 3.5E−04 | 131 |
|  | 20 | NO | P | 54 | 3.6E−04 | 130 |
| 150° C. | 0 | O | NP | 86 | 3.6E−04 | 132 |
|  | 0.5 | NO | NP | 83 | 3.6E−04 | 130 |
|  | 1 | O | P | 81 | 3.6E−04 | 131 |
|  | 3 | O | P | 78 | 3.3E−04 | 106 |
|  | 6 | O | P | 74 | 3.4E−04 | 107 |
|  | 10 | NO | P | 65 | 3.5E−04 | 130 |
|  | 20 | NO | P | 54 | 3.6E−04 | 131 |

O: Oriented,
NO: Not oriented,
P: With polarity,
NP: Without polarity

Table 11 shows, when the zinc oxide film thickness is 75 nm, the resistivity of 5.7 to 5.8×10⁻⁴ Ωcm without the presence of the sublayer and also a value of 4.6 to 4.8×10⁻⁴ Ωcm smaller than those resistivities in some cases. Any of them exhibit the c-axis orientation and the polarity. Noticeably, in their stabilities of resistivity, the zinc oxide thin films with a stability of only 175% to 178% are improved to have about 115% in stability in these cases. When the zinc oxide film thicknesses are 150 nm and 300 nm, although the resistivities are originally different, among those where the resistivities are smaller, and further where the stabilities of resistivity are improved, any of them exhibit the c-axis orientation and the polarity. However, the larger the film thickness of the sublayer, the lower the transmittance is liable to be. In addition, as the film thickness of the zinc oxide thin film is large, the transmittance is prone to decrease. This seems to come from a change in reflectance due to light interference of the zinc oxide thin film. Additionally, as compared with the case of Example 1, the range of the substrate temperature of the sublayer and the film thickness, which generate such effects, are slightly different. This seems to be because, although the sublayer was identical, the surface state of the sublayer or the structure was changed due to the temperature when the zinc oxide thin film was formed. In particular, the present Example and Example 3 show that, a temperature of 200° C. to 300° C. at the time of zinc oxide thin film fabrication makes it possible to particularly control the c-axis orientation and the polarity. Thereby, a low resistivity and a particularly excellent stability of resistivity are likely to be achieved.

When the zinc oxide thin film is used as a transparent conductive film in this way, the transmittance and resistivity need to be selected according to its purposes. Meanwhile, a lower resistance state and a more stable state can be attained in the zinc oxide thin film of the present invention.

Example 5

In the present Example, in an initial stage of forming a zinc oxide thin film, a film was formed by 10 nm at room temperature (herein, this is called an initial stage film formation). Thereafter, in film fabricating conditions of each zinc oxide thin film, a residual film thickness was also continuously attempted to be vapor deposited.

For formation of the initial stage film, first, the following surface treatment was implemented for a cleaned substrate. Firstly, the substrate was fixed to a special-purpose brass substrate holder, and the whole was placed on a heater stage to be heated to 150° C. (note that the heater stage and the substrate holder were heated at 200° C. in advance and irradiated with an ultraviolet ray so as not to contaminate the substrate surface with a generated gas). In this state, a teflon rod separately heated in a thermostat at the same temperature was strongly robbed by hand (with heat resistant gloves) in one direction several times (this rubbing-implemented direction is called a rubbing direction). The temperature of the glass substrate treated this way was returned to room temperature, and then the substrate was similarly carried in the film fabricating equipment. Next, a sublayer was formed as described above. Furthermore, a zinc oxide thin film was formed by 10 nm on this substrate at a substrate temperature of room temperature. To restraint rapid growth of the zinc oxide thin film, a sputtering electric power was selected as low as possible.

Table 14 shows the relation between the thickness of sublayer and the temperature of sublayer on top of a film whose surface has been treated on the glass substrate obtained in the above-described manner.

TABLE 14

| Thickness of sublayer (nm) | Temperature of sublayer | | | |
|---|---|---|---|---|
| | Room temperature (23° C.) | 50° C. | 100° C. | 150° C. |
| 0 | D | D | D | D |
| 0.5 | D | D | D | D |
| 1 | ND | ND | ND | ND |
| 3 | ND | ND | ND | ND |
| 6 | ND | ND | ND | ND |

TABLE 14-continued

| Thickness of sublayer (nm) | Temperature of sublayer | | | |
|---|---|---|---|---|
| | Room temperature (23° C.) | 50° C. | 100° C. | 150° C. |
| 10 | ND | ND | ND | ND |
| 20 | ND | ND | ND | ND |

D: XPS signal detected,
ND: Not detected

As shown in Table 14, the present Example studied several sublayer temperatures. XPS signals from the substrate below the sublayer having a thickness of 1 nm or above were not substantially detected, and therefore a sufficient coverage was thought to be obtained.

In addition, as the results of the present Example, Tables 15 and 16 summarize, when the film thickness of the zinc oxide thin film was 150 nm, and when the temperatures of substrate were room temperature and 200° C., physical properties of the resulting zinc oxide thin film such as c-axis orientation, polarity, transmittance, resistivity and stability of resistivity, for every temperature of sublayer and every thickness of sublayer.

TABLE 15

ZnO film thickness: 150 nm
Substrate temperature: Room temperature (23° C.)
Initial stage film formation: Present

| Temperature of sublayer | Thickness of sublayer (nm) | orientation of c-axis | Polarity | Transmittance (%) | Resistivity (Ωcm) | Stability of resistivity (%) |
|---|---|---|---|---|---|---|
| Room temperature (23° C.) | 0 | NO | NP | 93 | 1.8E−03 | 169 |
| | 0.5 | NO | P | 91 | 1.8E−03 | 170 |
| | 1 | O | P | 89 | 1.3E−03 | 114 |
| | 3 | O | P | 88 | 1.3E−03 | 114 |
| | 6 | O | P | 84 | 1.3E−03 | 114 |
| | 10 | O | P | 81 | 1.3E−03 | 115 |
| | 20 | O | P | 74 | 1.3E−03 | 115 |
| 50° C. | 0 | NO | NP | 91 | 1.8E−03 | 169 |
| | 0.5 | NO | P | 90 | 1.8E−03 | 170 |
| | 1 | NO | P | 88 | 1.8E−03 | 168 |
| | 3 | O | P | 88 | 1.3E−03 | 114 |
| | 6 | O | P | 86 | 1.3E−03 | 114 |
| | 10 | O | P | 81 | 1.3E−03 | 114 |
| | 20 | O | P | 73 | 1.3E−03 | 115 |
| 100° C. | 0 | NO | NP | 92 | 1.8E−03 | 169 |
| | 0.5 | NO | P | 90 | 1.8E−03 | 169 |
| | 1 | NO | P | 88 | 1.8E−03 | 169 |
| | 3 | NO | P | 88 | 1.8E−03 | 169 |
| | 6 | O | P | 85 | 1.3E−03 | 115 |
| | 10 | O | P | 81 | 1.3E−03 | 114 |
| | 20 | O | P | 73 | 1.3E−03 | 115 |
| 150° C. | 0 | NO | NP | 92 | 1.8E−03 | 170 |
| | 0.5 | NO | P | 91 | 1.8E−03 | 170 |
| | 1 | NO | P | 89 | 1.8E−03 | 169 |
| | 3 | NO | P | 88 | 1.8E−03 | 169 |
| | 6 | O | P | 85 | 1.3E−03 | 115 |
| | 10 | O | P | 80 | 1.3E−03 | 115 |
| | 20 | O | P | 74 | 1.3E−03 | 115 |

O: Oriented,
NO: Not oriented,
P: With polarity,
NP: Without polarity

TABLE 16

ZnO film thickness: 150 nm
Substrate temperature: 200° C.
Initial stage film formation: Present

| Temperature of sublayer | Thickness of sublayer (nm) | orientation of c-axis | Polarity | Transmittance (%) | Resistivity ($\Omega$cm) | Stability of resistivity (%) |
|---|---|---|---|---|---|---|
| Room temperature (23° C.) | 0 | NO | NP | 92 | 8.8E−04 | 150 |
| | 0.5 | NO | P | 91 | 8.7E−04 | 150 |
| | 1 | O | P | 89 | 6.4E−04 | 111 |
| | 3 | O | P | 87 | 6.4E−04 | 110 |
| | 6 | O | P | 86 | 6.5E−04 | 110 |
| | 10 | O | P | 80 | 6.5E−04 | 110 |
| | 20 | O | P | 73 | 6.4E−04 | 110 |
| 50° C. | 0 | NO | NP | 92 | 9.0E−04 | 152 |
| | 0.5 | NO | P | 91 | 9.0E−04 | 152 |
| | 1 | NO | P | 88 | 8.8E−04 | 152 |
| | 3 | O | P | 88 | 6.6E−04 | 112 |
| | 6 | O | P | 85 | 6.5E−04 | 110 |
| | 10 | O | P | 80 | 6.5E−04 | 111 |
| | 20 | O | P | 73 | 6.6E−04 | 110 |
| 100° C. | 0 | NO | NP | 92 | 9.0E−04 | 150 |
| | 0.5 | NO | P | 90 | 8.8E−04 | 150 |
| | 1 | NO | P | 90 | 9.0E−04 | 151 |
| | 3 | NO | P | 87 | 8.8E−04 | 151 |
| | 6 | O | P | 86 | 6.7E−04 | 110 |
| | 10 | O | P | 81 | 6.4E−04 | 111 |
| | 20 | O | P | 73 | 6.6E−04 | 112 |
| 150° C. | 0 | NO | NP | 92 | 8.8E−04 | 152 |
| | 0.5 | NO | P | 90 | 8.9E−04 | 150 |
| | 1 | NO | P | 90 | 9.1E−04 | 150 |
| | 3 | NO | P | 88 | 8.7E−04 | 152 |
| | 6 | O | P | 86 | 6.4E−04 | 111 |
| | 10 | O | P | 81 | 6.6E−04 | 110 |
| | 20 | O | P | 74 | 6.6E−04 | 111 |

O: Oriented,
NO: Not oriented,
P: With polarity,
NP: Without polarity

Table 15 shows, when the substrate temperature is room temperature, the resistivity of $1.8 \times 10^{-3}$ $\Omega$cm without the presence of the sublayer and also a value of $1.3 \times 10^{-3}$ $\Omega$cm smaller than that resistivity in some cases. Any of them exhibit the c-axis orientation and the polarity. Noticeably, in their stabilities of resistivity, the zinc oxide thin films with a stability of only about 170% are improved to have about 114% in stability in these cases. Table 16 shows, when the substrate temperature is 200° C., the resistivity of about $9.0 \times 10^{-4}$ $\Omega$cm without the presence of the sublayer and also a value of about $6.5 \times 10^{-4}$ $\Omega$cm smaller than that resistivity in some cases. Any of them exhibit the c-axis orientation and the polarity. Noticeably, in their stabilities of resistivity, the zinc oxide thin films with a stability of only about 150% are improved to have about 110% in stability in these cases. However, the larger the film thickness of the sublayer, the lower the transmittance is liable to be. In addition, as the film thickness of the zinc oxide thin film is large, the transmittance is prone to decrease. This seems to come from a change in reflectance due to light interference of the zinc oxide thin film. Additionally, as compared with the case of Example 1, the ranges of the substrate temperature of the sublayer and the film thickness, which generate such effects, are slightly different. This seems to be because, although the sublayer was identical, the surface state of the sublayer or the structure was changed due to the temperature when the zinc oxide thin film was formed. Moreover, the orientations of the internal surfaces of these films were analyzed by X-ray diffraction. In particular, when the ratio $[(Ia//)/(Ia//+Ia\perp)]$ is defined as the degree of orientation (%) of the internal surface in the a-axis (where $Ia//$ is a diffraction intensity of the zinc oxide thin film in the a-axis when measurement is performed in parallel with the rubbing direction, and where $Ia\perp$ is a diffraction intensity of the zinc oxide thin film in the a-axis when measurement is performed perpendicularly to the rubbing direction), the degrees of orientation in any cases were 70% or higher.

When the zinc oxide thin film is used as a transparent conductive film in this way, the transmittance and resistivity need to be selected according to its purposes. Meanwhile, a lower resistance state and a more stable state can be attained in the zinc oxide thin film of the present invention.

Example 6

In the present Example, for further improvement of characteristics of a zinc oxide thin film, surface modification was performed on the uppermost layer of the resultant zinc oxide thin film.

Specifically, a sample of the zinc oxide thin film fabricated by the method of Example 5 was carried to the deposition chamber 43 without breaking the vacuum immediately after the film was formed in the sputter chamber 42. There, zinc was vapor deposited in vacuum extremely thinly on top of the uppermost layer in the same procedure as in Example 1. More specifically, the substrate temperature at the time of formation of the uppermost layer was set at room temperature, and the film thickness of the uppermost zinc layer was set at 3 nm. Changes in resistivity before and after the implementation of such surface treatment are summarized in Tables 17 and 18 at room temperature and 200° C., respectively, during zinc oxide thin film formation, the zinc oxide thin film having a film thickness of 150 nm.

TABLE 17

| Temperature of sublayer | Thickness of sublayer (nm) | Resistivity (before) (Ωcm) | Resistivity (after) (Ωcm) |
|---|---|---|---|
| Room temperature (23° C.) | 0 | 1.8E−03 | 1.7E−03 |
| | 0.5 | 1.8E−03 | 1.5E−03 |
| | 1 | 1.3E−03 | 1.0E−03 |
| | 3 | 1.3E−03 | 1.1E−03 |
| | 6 | 1.3E−03 | 9.5E−04 |
| | 10 | 1.3E−03 | 1.1E−03 |
| | 20 | 1.3E−03 | 1.1E−03 |
| 50° C. | 0 | 1.8E−03 | 1.3E−03 |
| | 0.5 | 1.8E−03 | 1.5E−03 |
| | 1 | 1.8E−03 | 1.6E−03 |
| | 3 | 1.3E−03 | 9.8E−04 |
| | 6 | 1.3E−03 | 1.2E−03 |
| | 10 | 1.3E−03 | 1.1E−03 |
| | 20 | 1.3E−03 | 1.2E−03 |
| 100° C. | 0 | 1.8E−03 | 1.6E−03 |
| | 0.5 | 1.8E−03 | 1.4E−03 |
| | 1 | 1.8E−03 | 1.7E−03 |
| | 3 | 1.8E−03 | 1.4E−03 |
| | 6 | 1.3E−03 | 1.2E−03 |
| | 10 | 1.3E−03 | 1.2E−03 |
| | 20 | 1.3E−03 | 1.2E−03 |
| 150° C. | 0 | 1.8E−03 | 1.7E−03 |
| | 0.5 | 1.8E−03 | 1.6E−03 |
| | 1 | 1.8E−03 | 1.5E−03 |
| | 3 | 1.8E−03 | 1.5E−03 |
| | 6 | 1.3E−03 | 9.6E−04 |
| | 10 | 1.3E−03 | 9.5E−04 |
| | 20 | 1.3E−03 | 1.0E−03 |

TABLE 18

| Temperature of sublayer | Thickness of sublayer (nm) | Resistivity (before) (Ωcm) | Resistivity (after) (Ωcm) |
|---|---|---|---|
| Room temperature (23° C.) | 0 | 8.8E−04 | 6.3E−04 |
| | 0.5 | 8.7E−04 | 7.2E−04 |
| | 1 | 6.4E−04 | 4.6E−04 |
| | 3 | 6.4E−04 | 5.6E−04 |
| | 6 | 6.5E−04 | 5.7E−04 |
| | 10 | 6.5E−04 | 5.6E−04 |
| | 20 | 6.4E−04 | 4.6E−04 |
| 50° C. | 0 | 9.0E−04 | 8.4E−04 |
| | 0.5 | 9.0E−04 | 6.6E−04 |
| | 1 | 8.8E−04 | 7.0E−04 |
| | 3 | 6.6E−04 | 4.6E−04 |
| | 6 | 6.5E−04 | 6.4E−04 |
| | 10 | 6.5E−04 | 4.9E−04 |
| | 20 | 6.6E−04 | 4.9E−04 |
| 100° C. | 0 | 9.0E−04 | 8.5E−04 |
| | 0.5 | 8.8E−04 | 7.6E−04 |
| | 1 | 9.0E−04 | 7.8E−04 |
| | 3 | 8.8E−04 | 7.4E−04 |
| | 6 | 6.7E−04 | 6.2E−04 |
| | 10 | 6.4E−04 | 5.8E−04 |
| | 20 | 6.6E−04 | 5.2E−04 |
| 150° C. | 0 | 8.8E−04 | 6.7E−04 |
| | 0.5 | 8.9E−04 | 7.3E−04 |
| | 1 | 9.1E−04 | 8.1E−04 |
| | 3 | 8.7E−04 | 6.2E−04 |
| | 6 | 6.4E−04 | 6.2E−04 |
| | 10 | 6.6E−04 | 5.2E−04 |
| | 20 | 6.6E−04 | 5.8E−04 |

Tables 17 and 18 show that, in any of the cases, the resistivities after the surface treatment are further decreased. Although not particularly shown, the formation of the uppermost zinc layer of this thickness rarely altered the transmittance. Formation of a thicker uppermost zinc layer enables further decrease in resistivity; however, it is preferred that the thickness is, as appropriate, set in consideration of characteristics as a transparent conductive film, since the transmittance may be gradually decreased.

| Explanation of Reference Numerals | |
|---|---|
| 1 | zinc oxide thin film |
| 2 | substrate |
| 3 | c-axis direction of zinc oxide thin film |
| 4 | uppermost layer |
| 5 | lowermost layer |
| 10 | transparent electrode |
| 11 | oriented film |
| 12 | black matrix |
| 13 | liquid crystal |
| 14 | RGB color filter |
| 15 | glass substrate |
| 16 | polarizer film |
| 17 | adhesion material |
| 18 | fluorescent light |
| 19 | driving IC |
| 20 | transparent electrode |
| 21 | full surface glass substrate |
| 22 | bus electrode |
| 23 | dielectric layer |
| 24 | cover layer |
| 25 | bank |
| 26 | dielectric layer |
| 27 | display electrode |
| 28 | phosphor |
| 29 | back surface substrate |
| 30 | transparent electrode |
| 31 | organic layer |
| 32 | cathode |
| 33 | glass substrate |
| 34 | bank |
| 35 | encapsulation cap |
| 40 | loading chamber |
| 41 | analysis chamber |
| 42 | sputter chamber |
| 43 | deposition chamber |
| 44 | transfer chamber |
| 45 | valve |
| 50 | substrate |
| 51 | metal thin film layer |
| 52 | zinc oxide thin film |

What is claimed is:

1. A zinc oxide thin film laminated on a substrate, comprising:
   a first metal thin film layer on which the zinc oxide thin film is formed by a thin film fabricating technique,
   wherein the zinc oxide thin film is a crystalline thin film of a wurtzite form, and
   a second metal thin film layer different from the zinc oxide thin film laminated directly on the crystalline thin film,
   wherein the second metal thin film layer is metal zinc.

2. The zinc oxide thin film according to claim 1, wherein the second metal thin film layer is a transparent electrode film.

3. The zinc oxide thin film according to claim 1, wherein the film thickness of the first metal thin film layer is from 1 nm to 20 nm.

4. The zinc oxide thin film according to claim 1, wherein the first metal thin film layer has a positive ionic polar substituent group on the upper surface.

5. The zinc oxide thin film according to claim 1, wherein the film thickness of the second metal thin film layer is from 1 nm to 20 nm.

6. A zinc oxide thin film laminated on an amorphous substrate comprising:

a metal thin film layer, which is formed on the amorphous substrate;

a zinc oxide thin film, which is formed on the metal thin film layer; and a second metal thin film layer, which is formed on the zinc oxide thin film, wherein the second metal thin film layer is different from the zinc oxide thin film, wherein the zinc oxide thin film is a crystalline thin film of a wurtzite form, the c-axis of the zinc oxide thin film is oriented in a direction substantially perpendicular to the amorphous substrate, a zinc surface is formed in an uppermost layer of the zinc oxide thin film, and the zinc surface is a polar surface of the zinc oxide thin film in the c-axis direction.

7. The zinc oxide thin film according to claim 6, wherein the a-axis direction of the crystalline thin film is oriented in one direction within the surface of the zinc oxide thin film.

* * * * *